United States Patent
Ichijo et al.

(10) Patent No.: US 8,809,203 B2
(45) Date of Patent: Aug. 19, 2014

(54) METHOD FOR MANUFACTURING SEMICONDUCTOR DEVICE USING A MICROWAVE PLASMA CVD APPARATUS

(75) Inventors: Mitsuhiro Ichijo, Kanagawa (JP); Tetsuhiro Tanaka, Tochigi (JP); Takashi Ohtsuki, Kanagawa (JP); Seiji Yasumoto, Tochigi (JP); Kenichi Okazaki, Tochigi (JP); Shunpei Yamazaki, Tokyo (JP); Naoya Sakamoto, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 514 days.

(21) Appl. No.: 12/130,307

(22) Filed: May 30, 2008

(65) Prior Publication Data
US 2009/0011611 A1 Jan. 8, 2009

(30) Foreign Application Priority Data

Jun. 5, 2007 (JP) ................................. 2007-149790
Jul. 27, 2007 (JP) ................................. 2007-196781

(51) Int. Cl.
*H01L 21/469* (2006.01)

(52) U.S. Cl.
USPC .................... 438/769; 438/786; 257/E21.267

(58) Field of Classification Search
USPC .................................................. 438/769, 786
See application file for complete search history.

(56) References Cited

U.S. PATENT DOCUMENTS

| | | | |
|---|---|---|---|
| 4,409,134 A | 10/1983 | Yamazaki | |
| 5,134,965 A | 8/1992 | Tokuda et al. | |
| 5,639,309 A | 6/1997 | Akimoto | |
| 5,846,885 A * | 12/1998 | Kamata et al. | 438/729 |
| 6,164,295 A | 12/2000 | Ui et al. | |
| 6,489,238 B1 | 12/2002 | Tsui | |
| 6,919,282 B2 * | 7/2005 | Sakama et al. | 438/769 |
| 7,038,303 B2 | 5/2006 | Muranaka | |
| 7,265,393 B2 | 9/2007 | Schuele et al. | |
| 7,897,205 B2 | 3/2011 | Kameshima et al. | |
| 8,017,455 B2 | 9/2011 | Muranaka | |
| 2005/0062409 A1* | 3/2005 | Yamazaki et al. | 313/504 |
| 2005/0088088 A1* | 4/2005 | Yamazaki | 313/512 |
| 2005/0205015 A1 | 9/2005 | Sasaki et al. | |
| 2005/0238816 A1 | 10/2005 | Hou et al. | |

(Continued)

FOREIGN PATENT DOCUMENTS

| | | |
|---|---|---|
| EP | 1 286 387 A2 | 2/2003 |
| JP | 03-094422 | 4/1991 |

(Continued)

*Primary Examiner* — Thanh Nguyen

(74) *Attorney, Agent, or Firm* — Nixon Peabody, LLP; Jeffrey L. Costellia

(57) ABSTRACT

It is an object to provide a method for manufacturing a semiconductor device that has a semiconductor element including a film in which mixing impurities is suppressed. It is another object to provide a method for manufacturing a semiconductor device with high yield. In a method for manufacturing a semiconductor device in which an insulating film is formed in contact with a semiconductor layer provided over a substrate having an insulating surface with use of a plasma CVD apparatus, after an inner wall of a reaction chamber of the plasma CVD apparatus is coated with a film that does not include an impurity to the insulating film, a substrate is introduced in the reaction chamber, and the insulating film is deposited over the substrate. As a result, an insulating film in which the amount of impurities is reduced can be formed.

27 Claims, 21 Drawing Sheets

(56) References Cited

U.S. PATENT DOCUMENTS

| | | |
|---|---|---|
| 2006/0081558 A1* | 4/2006 | Collins et al. .................. 216/67 |
| 2006/0270191 A1* | 11/2006 | Tamura et al. ................ 438/458 |
| 2010/0239782 A1 | 9/2010 | Sasaki et al. |

FOREIGN PATENT DOCUMENTS

| | | |
|---|---|---|
| JP | 8-055804 | 2/1996 |
| JP | 08-255785 | 10/1996 |
| JP | 10-050685 | 2/1998 |
| JP | 2000-200786 | 7/2000 |
| JP | 2002-158218 | 5/2002 |
| JP | 3400293 B2 | 2/2003 |
| JP | 3400293 B2 | 4/2003 |
| JP | 2003-197617 | 7/2003 |
| JP | 2004-296963 | 10/2004 |
| JP | 2006-013361 | 1/2006 |
| JP | 2006-294816 | 10/2006 |
| JP | 2007-533860 | 11/2007 |

* cited by examiner

METHOD FOR MANUFACTURING SEMICONDUCTOR DEVICE USING A MICROWAVE PLASMA CVD APPARATUS

BACKGROUND OF THE INVENTION

1. Field of the Invention

The present invention relates to a semiconductor device that has a semiconductor element typified by a transistor.

2. Description of the Related Art

In recent years, technology that is used to form thin film transistors using semiconductor thin films (with thicknesses of from several nanometers to several hundreds of nanometers, approximately) that are formed over substrates that have an insulating surface has been attracting attention. Instead of silicon wafers that are manufactured by thinly cutting an ingot of a single-crystal semiconductor, semiconductor substrates called silicon-on-insulator (SOI) substrates have been developed, which have a thin single crystalline semiconductor layer over an insulating film. Also, semiconductor devices in which the semiconductor substrate is used have been developed.

Semiconductor elements such as thin film transistors and MOS transistors are formed by stacking a conductive film, a semiconductor film, and an insulating film, and each film is formed by a sputtering method, a plasma CVD method, a coating method, or the like.

Film formation over a substrate in a plasma CVD apparatus has a problem in that reaction products are deposited in a reaction chamber, and when the deposited products are accumulated thick, the deposited products flake away on the substrate, which causes operation defects of a semiconductor element to be manufactured.

Thus, the inside of the reaction chamber is cleaned by the chemical reaction after film formation for a certain period. Specifically, the deposition products in the reaction chamber are removed using fluorine plasma or a cleaning liquid.

On the other hand, there is a problem in that a gas or liquid used for cleaning is left in the reaction chamber, and the residual gas or liquid is mixed into a film formed over the substrate. Therefore, there is an example in which a protective film is formed on an inner wall of the reaction chamber after the reaction chamber is cleaned (Reference 1: Japanese Patent No. 3400293).

SUMMARY OF THE INVENTION

However, depending on a productive film formed on the inner wall of the reaction chamber of the plasma CVD apparatus, there is a problem in that the protective film is mixed to a film formed over the substrate, and film quality and characteristics of a semiconductor element are degraded.

In view of the foregoing problems, it is an object of the present invention to provide a method for manufacturing a semiconductor device which includes a semiconductor element having a film in which mixing impurities is suppressed. It is another object to provide a method for manufacturing a semiconductor device with high yield.

In a method for manufacturing a semiconductor device in which an insulating film is formed in contact with a semiconductor layer provided over a substrate having an insulating surface with use of a plasma CVD apparatus, an inner wall of a reaction chamber of the plasma CVD apparatus is coated with a film that does not include impurities of the insulating film; the substrate is introduced into the reaction chamber; and the insulating film is formed over the substrate. Accordingly, an insulating film in which mixing impurities is suppressed can be obtained over the substrate. Further, the inner wall of the reaction chamber of the plasma CVD apparatus is coated with a film that is different from the film deposited over the substrate and does not include impurities of the deposited film, whereby an insulating film in which impurities is reduced can be formed over the substrate.

As one of typical examples of a semiconductor device, a microprocessor, a computer that transmits/receives signals to/from an external device by wireless communication, an IC tag, or the like can be given.

Another typical example of a semiconductor device is a display device, which includes a light-emitting device or a liquid crystal display device. The light-emitting device includes a light-emitting element, and the liquid crystal display device includes a liquid crystal element. The light-emitting element includes in its category an element of which luminance is controlled by a current or a voltage; specifically, inorganic EL (Electro Luminescence), an organic EL, an electron source element (electron-emitting element) used in an FED (Field Emission Display), and the like are included.

In addition, the display device includes a panel where a display element is sealed and a module where an IC such as a controller or the like is mounted on the panel. Further, the present invention relates to an element substrate corresponding to one mode before the display element is completed in a process of manufacturing the light-emitting device. The element substrate is provided with a unit for supplying current to the light-emitting element in each of plural pixels. The element substrate can have any modes; for example, the element substrate may be in a state where only a pixel electrode of the display element is formed or in a state where a conductive film to be the pixel electrode is formed but etching has not be done; therefore, the pixel electrode has not been completed yet.

Note that a display device in this specification means an image display device a light-emitting device, or a light source (including an illuminating device). Further, the display device includes any of the following modules in its category: a module in which a connector such as a flexible printed circuit (FPC), a tape automated bonding (TAB) tape, or a tape carrier package (TCP) is attached to a light-emitting device; a module having a TAB tape or a TCP provided with a printed wiring board at the end thereof; or a module having an integrated circuit (IC) directly mounted over a light-emitting element by a chip on glass (COG) method.

In accordance with the present invention, an inner wall of a reaction chamber of a plasma CVD apparatus is coated with a film that does not include an impurity to an insulating film deposited over a substrate (protective film), whereby a deposited film in which the impurities is reduced can be formed over the substrate. Further, the inner wall of the reaction chamber of the plasma CVD apparatus is coated with a film that is different from the film deposited over the substrate and does not include an impurity to the deposited film, whereby an insulating film in which the impurities is reduced can be formed over the substrate. Therefore, deterioration in characteristics of a semiconductor element, which is formed using the deposited film, can be avoided. Further, a semiconductor device can be manufactured with high yield.

Further, by using a microwave plasma CVD apparatus with a frequency of 1 GHz or higher, the kinds and the flow rate of a source gas can be reduced, and in addition, a deposited film with less plasma damage can be formed.

DETAILED DESCRIPTION OF THE INVENTION

Figure 1:
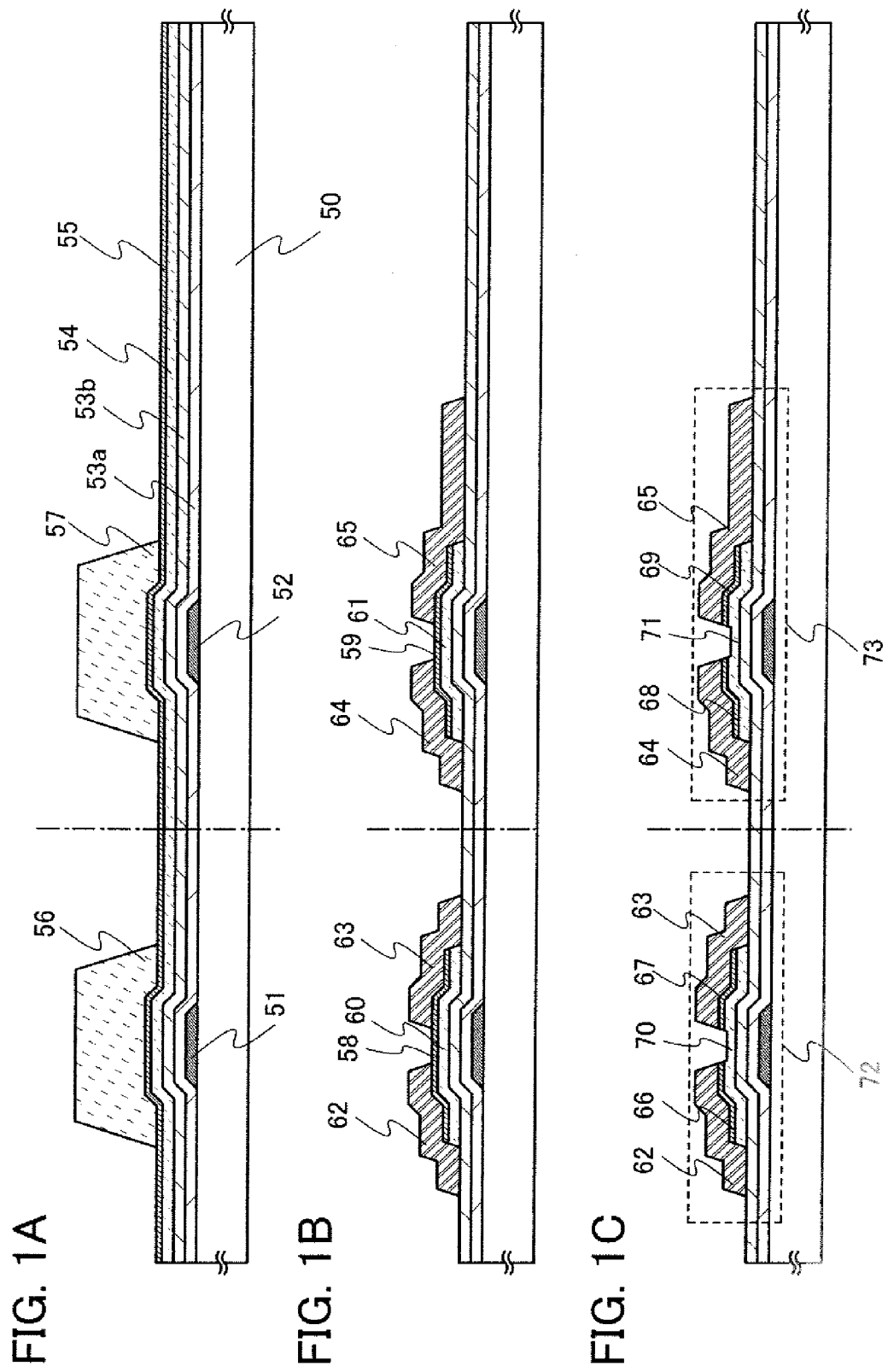
FIGS. 1A to 1C are cross-sectional views describing a method for manufacturing a semiconductor device of the present invention.

Embodiment modes of the present invention will be hereinafter described in detail with reference to the accompanying drawings. However, it is easily understood by those who are skilled in the art that modes and details herein disclosed can be modified in various ways without departing from the purpose and the scope of the present invention. Therefore, the present invention is not construed as being limited to description of the embodiment modes.

Embodiment Mode 1

A method for manufacturing a semiconductor device of the present invention will be described. First, the method is described on such conditions that a light-emitting device is used as one mode of the semiconductor device and a thin film transistor is used as a semiconductor element. In FIG. 1A to FIG. 3C, cross-sectional views of a thin film transistor that is used for a driver circuit and cross-sectional views of a thin film transistor that is used for a pixel portion are shown. Note that a p-channel semi-amorphous thin film transistor is more suitable for a driver circuit than an n-channel semi-amorphous thin film transistor because the p-channel semi-amorphous thin film transistor has higher mobility. However, in the present invention, either of a p-channel thin film transistor or an n-channel thin film transistor may be used. With any polarity of a thin film transistor, it is preferable that all the thin film transistors formed over one substrate have the same polarity so that the number of manufacturing steps is reduced.

As shown in FIG. 1A, gate electrodes 51 and 52 are formed over a substrate 50. As the substrate 50, a plastic substrate having heat resistance that can withstand a processing temperature of a manufacturing process or the like as well as a non-alkaline glass substrate manufactured by a fusion method or a float method such as a substrate of barium borosilicate glass, aluminoborosilicate glass, or aluminosilicate glass, and a ceramic substrate can be used. Alternatively, a metal substrate such as a stainless steel alloy substrate, provided with an insulating film over its surface, may also be used. As the substrate 50, a substrate having a size of 320 mm×400 mm, 370 mm×470 mm, 550 mm×650 mm, 600 mm×720 mm, 680 mm×880 mm, 730 mm×920 mm, 1000 mm×1200 mm, 1100 mm×1250 mm, 1150 mm×1300 mm, 1500 mm×1800 mm, 1900 mm×2200 mm, 2160 mm×2460 mm, 2400 mm×2800 mm, 2850 mm×3050 mm, or the like can be used.

The gate electrodes 51 and 52 are formed of a metal material such as titanium, molybdenum, chromium, tantalum, tungsten, or aluminum, or an alloy material thereof. The gate electrodes 51 and 52 can be formed as follows: a conductive film is formed over the substrate 50 by a sputtering method or a vacuum evaporation method, a mask is formed by a photolithography technique or an ink-jet method over the conductive film, and the conductive film is etched using the mask. Alternatively, the gate electrodes 51 and 52 can be formed by discharging a conductive nanopaste of silver, gold, copper, or the like by an ink-jet method and baking it. Note that a nitride film formed of the above metal material may be provided between the substrate 50 and the gate electrodes 51 and 52 to improve adherence of the gate electrodes 51 and 52 to the substrate 50 and serve as a barrier metal for preventing diffusion of impurities to the base film.

Since a semiconductor film and a wiring are formed over the gate electrodes 51 and 52, the gate electrodes 51 and 52 are preferably processed to have tapered end portions so that the semiconductor film and the wiring thereover are not disconnected. Further, although not illustrated, a wiring connected to the gate electrodes can also be formed at the same time when the gate electrodes are formed.

Next, gate insulating films 53a and 53b, a semiconductor film 54, and a semiconductor film 55 to which an impurity imparting one conductivity type is added are sequentially formed over the gate electrodes 51 and 52. It is preferable that at least the gate insulating films 53*a* and 53*b* and the semiconductor film 54 be formed in succession. Furthermore, it is preferable that the gate insulating films 53*a* and 53*b*, the semiconductor film 54, and the semiconductor film 55 to which an impurity imparting one conductivity type is added be formed in succession. When at least the gate insulating films 53*a* and 53*b* and the semiconductor film 54 are formed in succession without being exposed to air, each interface of stacked layers can be obtained, which are not contaminated by atmospheric components or impurity elements floating in air. Therefore, variation in characteristics of the thin film transistor can be reduced.

The gate insulating films 53*a* and 53*b* can each be formed of a silicon nitride film, a silicon oxynitride film, or a silicon nitride oxide film with use of a microwave CVD apparatus. A silicon oxynitride film is preferably formed as the gate insulating film 53*a*, and a silicon nitride film or a silicon nitride oxide film can be formed as the gate insulating film 53*b*. Although the gate insulating film here has a two-layer structure, a single layer is possible therefor. In that case, a single layer of the gate insulating film can be formed of a silicon nitride film or a silicon nitride oxide film. Further, a stacked structure of three or more layers is possible for the gate insulating film. In that case, the gate insulating film can be formed by stacking a silicon nitride film or a silicon nitride oxide film, a silicon oxide film or a silicon oxynitride film, and a silicon nitride film or a silicon nitride oxide film in this order from the substrate side.

The gate insulating films 53*a* and 53*b* are preferably formed by a microwave plasma CVD method with a frequency of 1 GHz or higher. In particular, it is preferable to use a microwave plasma CVD method in which the electron density is greater than or equal to $1\times10^{11}$ cm$^{-3}$ and less than or equal to $1\times10^{13}$ cm$^{-3}$, and the electron temperature is approximately greater than or equal to 0.2 eV and less than or equal to 2.0 eV (more preferably, greater than or equal to 0.5 eV and less than or equal to 1.5 eV). When plasma with high electron density and low electron temperature and kinetic energy of active species is utilized, a deposited film with less plasma damage in which defects are reduced can be formed.

The use of a microwave plasma CVD apparatus enables the kinds and the flow rate of source gases to be reduced, and reduction in cost and increase of throughput are possible.

In a case where a silicon oxynitride film is formed as the gate insulating film, a protective film that is a silicon oxynitride film or a silicon film is formed on an inner wall of a reaction chamber of the microwave plasma CVD apparatus.

In a case where a silicon nitride film is formed as the gate insulating film, a protective film that is a silicon nitride film or a silicon film is formed on the inner wall of the reaction chamber of the microwave plasma CVD apparatus.

In a case where a silicon nitride oxide film is formed as the gate insulating film, a protective film that is a silicon oxynitride film, a silicon nitride oxide film, a silicon nitride film, or a silicon film is formed on the inner wall of the reaction chamber of the microwave plasma CVD apparatus.

In such a manner, by coating the inner wall of the reaction chamber of the plasma CVD apparatus with a film that does not include an impurity to a deposited film, the deposited film in which the impurities to be deposited over the substrate are reduced can be formed. Further, by coating the inner wall of the reaction chamber of the plasma CVD apparatus with a protective film that is different from a film which is deposited over the substrate and does not include an impurity to the deposited film, the deposited film in which the amount of impurities is reduced can be formed over the substrate.

Note that a silicon oxynitride film means a film that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide film means a film that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride film or the silicon nitride oxide film is defined as 100 at. %.

As the semiconductor film 54, an amorphous semiconductor film or a microcrystalline semiconductor film (also referred to as a semi-amorphous semiconductor film) is formed using a semiconductor material gas typified by silane or germane, by a CVD method, a sputtering method, or a thermal CVD method. Furthermore, the amorphous semiconductor film or a microcrystalline semiconductor film may be subjected to thermal treatment or may be irradiated with a laser beam so as to be a crystalline semiconductor film. The semiconductor film 54 is formed to have a thickness of greater than or equal to 1 μm and less than or equal or 300 μm, preferably, greater than or equal to 5 μm and less than or equal or 200 μm.

The concentration of oxygen in the semiconductor film is preferably $1\times10^{19}$ cm$^{-3}$ or lower, and each concentration of nitrogen and carbon therein is preferably $1\times10^{19}$ cm$^{-3}$ or lower.

The microcrystalline semiconductor film used for the semiconductor film 54 is a film including a semiconductor having an intermediate structure between an amorphous semiconductor and a crystalline structure (including single crystal and polycrystal). This semiconductor has a third state which is stable in terms of free energy, and is a crystalline substance having short-range order and lattice distortion, which can be dispersed in an amorphous crystalline semiconductor with its grain size of 0.5 to 20 nm. Description of such a microcrystalline semiconductor film is disclosed, for example, in U.S. Pat. No. 4,409,134.

This microcrystalline semiconductor film can be formed by a microwave CVD apparatus with a frequency of 1 GHz or more. Typically, silicon hydride such as $SiH_4$ or $Si_2H_6$ or silicon halide such as $SiH_2Cl_2$, $SiHCl_3$, $SiCl_4$, or $SiF_4$ can be used for forming the microcrystalline semiconductor film. Further, silicon hydride or silicon halide is diluted with hydrogen or at least one of rare gas elements of helium, argon, krypton, and neon, so that the microcrystalline semiconductor film can be formed.

In addition, a carbide gas such as $CH_4$ or $C_2H_6$, or a germanide gas such as $GeH_4$ or $GeF_4$ may be mixed into silicon hydride or silicon halide to adjust the width of an energy band to be 1.5 to 2.4 eV, or 0.9 to 1.1 eV.

The microcrystalline semiconductor film has low n-type conductivity when an impurity element for controlling valence electrons is not added thereto intentionally. Therefore, an impurity element imparting p-type conductivity may be added to the microcrystalline semiconductor film which functions as a channel formation region of a thin film transistor at the same time as or after formation of the microcrystalline semiconductor film, so that the threshold voltage can be controlled. A typical example of the impurity element imparting p-type conductivity is boron, and an impurity gas such as $B_2H_6$ or $BF_3$ may be added to silicon hydride or silicon halide at a proportion of 1 to 1000 ppm, preferably 1 to 100 ppm. The concentration of boron is preferably set at $1\times10^{14}$ to $6\times10^{16}$ atoms/cm$^3$.

In a case where an n-channel thin film transistor is formed, phosphorus as a typical impurity element may be added to the semiconductor film 55 to which an impurity imparting one conductivity type is added, and an impurity gas such as $PH_3$ may be added to silicon hydride or silicon halide. In a case where a p-channel thin film transistor is formed, boron as a typical impurity element may be added, and an impurity gas such as $B_2H_6$ may be added to silicon hydride or silicon halide. The semiconductor film 55 to which an impurity imparting one conductivity type is added can be formed of a microcrystalline semiconductor film or an amorphous semiconductor film.

Figure 5:
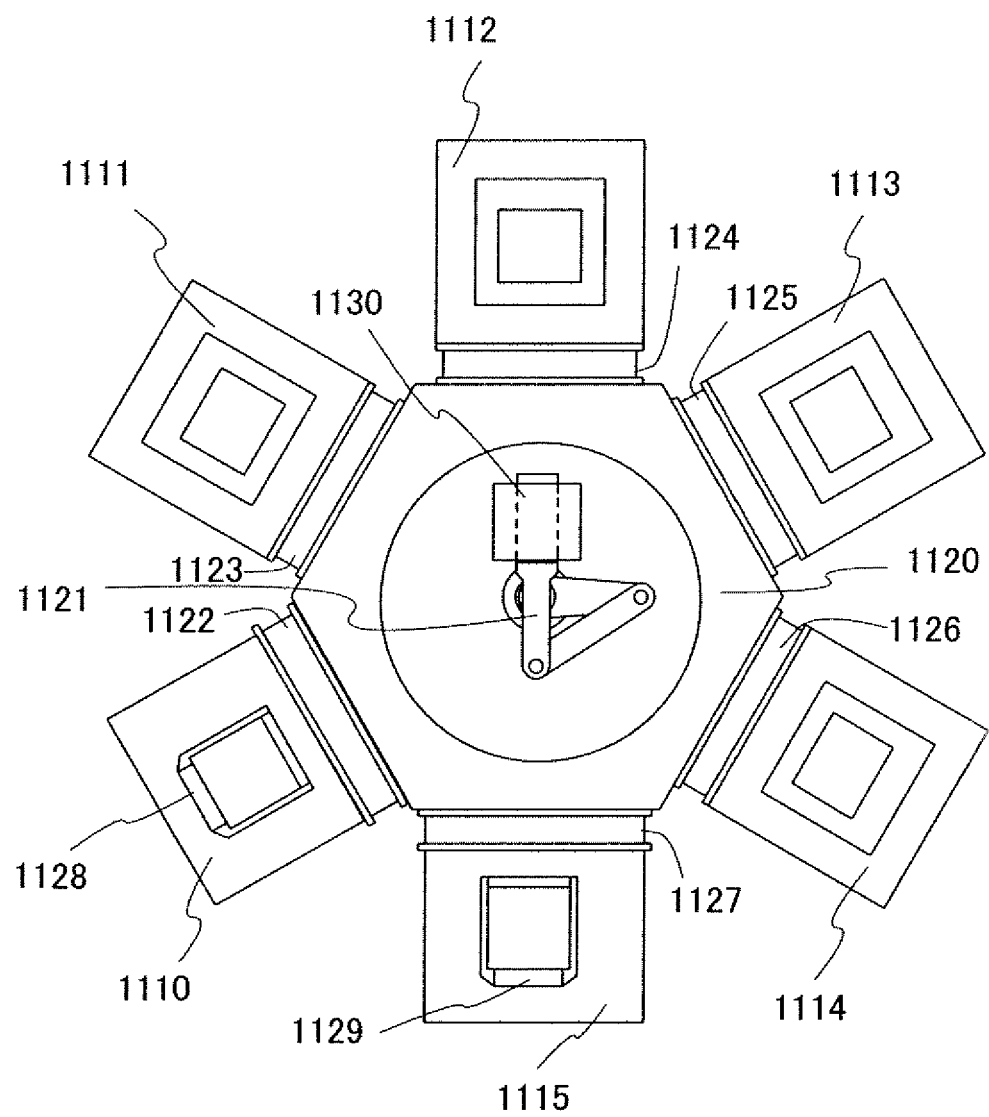
FIG. 5 is a top view describing a microwave plasma CVD apparatus of the present invention.

Here, a microwave plasma CVD apparatus is illustrated in FIG. 5, in which from the gate insulating films 53*a* and 53*b* to the semiconductor film 55 to which an impurity imparting one conductivity type is added can be formed in succession. FIG. 5 is a schematic view of a cross-section of upper part of a microwave plasma CVD apparatus, which has a structure in which a load chamber 1110, an unload chamber 1115, reaction chambers (1) to (4) 1111 to 1114 are provided around a common chamber 1120. Gate valves 1122 to 1127 are provided between the common chamber 1120 and each chamber such that treatment conducted in each chamber does not interfere to each other. The substrate is equipped with cassettes 1128 and 1129 which are provided in the load chamber 1110 and the unload chamber 1115, respectively, and transferred to the reaction chambers (1) to (4) 1111 to 1114 by a transfer unit 1121 of the common chamber 1120. In this apparatus, a reaction chamber can be provided for each kind of films to be deposited, and a plurality of different kinds of films can be formed in succession without being exposed to atmospheric air.

In a case where a gate insulating film is formed of two layers of a silicon oxynitride film and a silicon nitride film or a silicon nitride oxide film, each film of the thin film transistor may be formed as follows: the silicon oxynitride film of the gate insulating film is formed in the reaction chamber (1); the silicon nitride film or the silicon nitride oxide film thereof is formed in the reaction chamber (2); a semiconductor film is formed in the reaction chamber (3); and a semiconductor film to which an impurity imparting one conductivity type is added is formed in the reaction chamber (4).

At this time, after a protective film that is a silicon film is formed on an inner wall of the reaction chamber (1), the silicon oxynitride film is formed over the substrate. Note that a silicon oxynitride film may be formed as the protective film.

Next, the silicon nitride film or the silicon nitride oxide film is formed over the silicon oxynitride film after a protective film that is a silicon nitride film, a silicon nitride oxide film, a silicon oxynitride film, or a silicon film is formed on an inner wall of the reaction chamber (2). Note that in the case of forming the silicon nitride oxide film in the reaction chamber (2), after a silicon oxynitride film is formed as a protective film, the silicon nitride oxide film can be formed over the silicon oxynitride film.

Next, the semiconductor film is formed over the silicon nitride film or the silicon nitride oxide film after a semiconductor film that is a protective film is formed on an inner wall of the reaction chamber (3).

Next, the semiconductor film to which an impurity imparting one conductivity type is added is formed over the semiconductor film after a semiconductor film or a semiconductor film to which an impurity imparting one conductivity type is added is formed on an inner wall of the reaction chamber (4).

In a case where the gate insulating film is formed of two layers of a silicon oxynitride film and a silicon nitride film or a silicon nitride oxide film, each film of the thin film transistor may be formed as follows: the silicon oxynitride film and the silicon nitride film or the silicon nitride oxide film of the gate insulating film are formed in the reaction chamber (1); a semiconductor film is formed in the reaction chamber (2); and a semiconductor film to which an impurity imparting one conductivity type is added is formed in the reaction chamber (3).

At this time, after a protective film that is a silicon film is formed on the inner wall of the reaction chamber (1), the silicon oxynitride film is formed over the substrate, and the silicon nitride film or the silicon nitride oxide film is formed thereover. Note that a silicon oxynitride film may be used as the protective film.

Next, the semiconductor film is formed over the silicon nitride film or the silicon nitride oxide film after a protective film that is a semiconductor film is formed on the inner wall of the reaction chamber (2).

Next, the semiconductor film to which an impurity imparting one conductivity type is added is formed over the semiconductor film after a semiconductor film or a semiconductor film to which an impurity imparting one conductivity type is added is formed on the inner wall of the reaction chamber (3).

In a case where the gate insulating film is formed of two layers of a silicon oxynitride film and a silicon nitride film or a silicon nitride oxide film, each film of the thin film transistor may be formed as follows: the silicon oxynitride film and the silicon nitride film or the silicon nitride oxide film of the gate insulating film, and a semiconductor film are formed in the reaction chamber (1); and a semiconductor film to which an impurity imparting one conductivity type is added is formed in the reaction chamber (2).

At this time, after a protective film that is a silicon film is formed on the inner wall of the reaction chamber (1), the silicon oxynitride film is formed over the substrate, the silicon nitride film or the silicon nitride oxide film is formed thereover, and the semiconductor film is formed thereover. Note that a silicon oxynitride film may be formed as the protective film.

Next, the semiconductor film to which an impurity imparting one conductivity type is added is formed over the semiconductor film after a semiconductor film or a semiconductor film to which an impurity imparting one conductivity type is added is formed on the inner wall of the reaction chamber (2).

In a case where the gate insulating film is formed of a single layer, each film of the thin film transistor may be formed as follows: a silicon oxynitride film, a silicon nitride oxide film, or a silicon nitride film of the gate insulating film is formed in the reaction chamber (1); a semiconductor film is formed in the second reaction chamber (2); and a semiconductor film to which an impurity imparting one conductivity type is added is formed in the reaction chamber (3).

At this time, after a protective film is formed on the inner wall of the reaction chamber (1), the silicon oxynitride film, the silicon nitride oxide film, or the silicon nitride film is formed over the substrate. When the gate insulating film is formed of the silicon oxynitride film, a silicon film is formed as the protective film. Note that a silicon oxynitride film may be used as the protective film. When the gate insulating film is formed of the silicon nitride oxide film, a silicon oxynitride film, a silicon nitride film, or a silicon film is used as the protective film. Note that a silicon nitride oxide film may be used as the protective film. When the gate insulating film is formed of the silicon nitride film, a silicon film is formed as the protective film. Note that a silicon nitride film may be formed as the protective film.

Next, the semiconductor film is formed over the silicon oxynitride film, the silicon nitride oxide film, or the silicon nitride film after a protective film that is a semiconductor film is formed on the inner wall of the reaction chamber (2).

Next, the semiconductor film to which an impurity imparting one conductivity type is added is formed over the semiconductor film after a semiconductor film or a semiconductor film to which an impurity imparting one conductivity type is added is formed on the inner wall of the reaction chamber (3).

Alternatively, in a case where the gate insulating film is formed of a single layer, each film of the thin film transistor may be formed as follows: a silicon oxynitride film, a silicon nitride oxide film, or a silicon nitride film of the gate insulating film, and a semiconductor film are formed in the reaction chamber (1); and a semiconductor film to which an impurity imparting one conductivity type is added is formed in the reaction chamber (2).

At this time, after the protective film is formed depending on kinds of films of the gate insulating film on the inner wall of the reaction chamber (1), the gate insulating film is formed over the substrate, and the semiconductor film is formed thereover.

Next, the semiconductor film to which an impurity imparting one conductivity type is added is formed over the semiconductor film after a semiconductor film or a semiconductor film to which an impurity imparting one conductivity type is added is formed on the inner wall of the reaction chamber (2).

By using a microwave plasma CVD apparatus having such a structure, a different kind of film can be formed in each reaction chamber, and the films can be formed in succession without being exposed to atmospheric air. Therefore, each interface of stacked layers can be obtained, which is not contaminated by a residue of a film which has been formed in advance and an impurity element floating in air.

Note that the load chamber and the unload chamber are independently provided in the microwave plasma CVD apparatus shown in FIG. 5; however, the load chamber and the unload chamber may be unified to be a load/unload chamber. In addition, a spare chamber may be provided in the microwave plasma CVD apparatus. Preliminary heating the substrate in the spare chamber makes it possible to shorten the heating time when film is formed in each reaction chamber. Therefore, throughput can be improved.

Figure 6A:
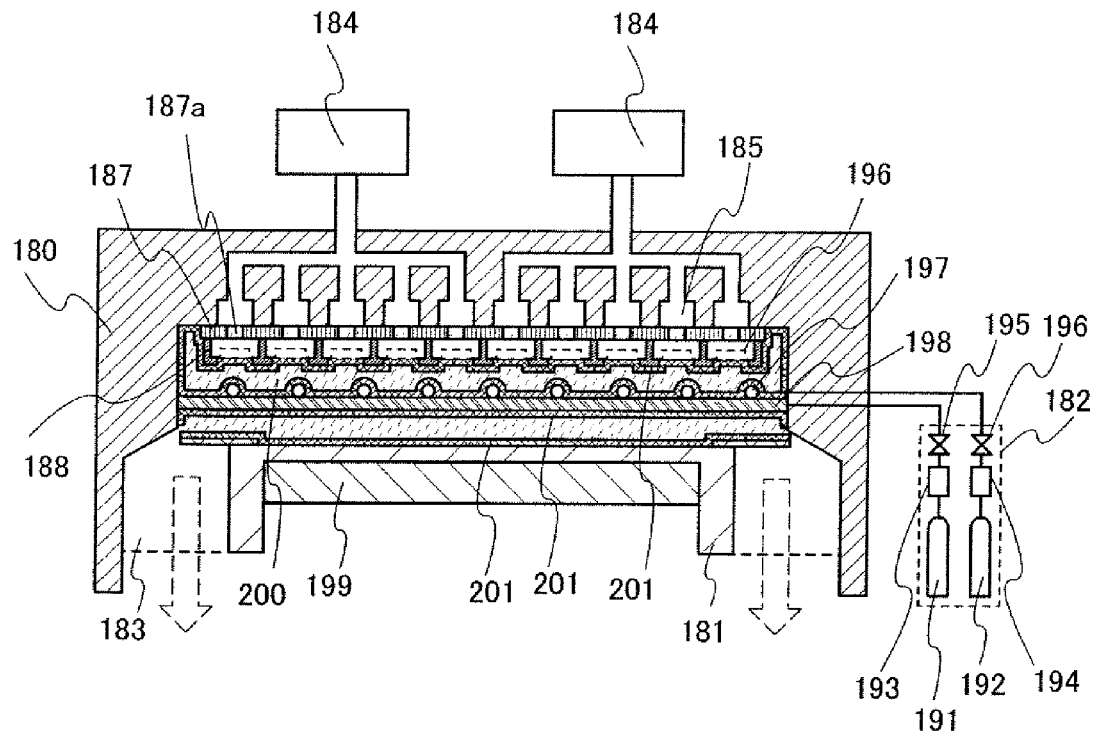
FIGS. 6A and 6B are cross-sectional views describing a reaction chamber of a microwave plasma CVD apparatus of the present invention.
Figure 6B:
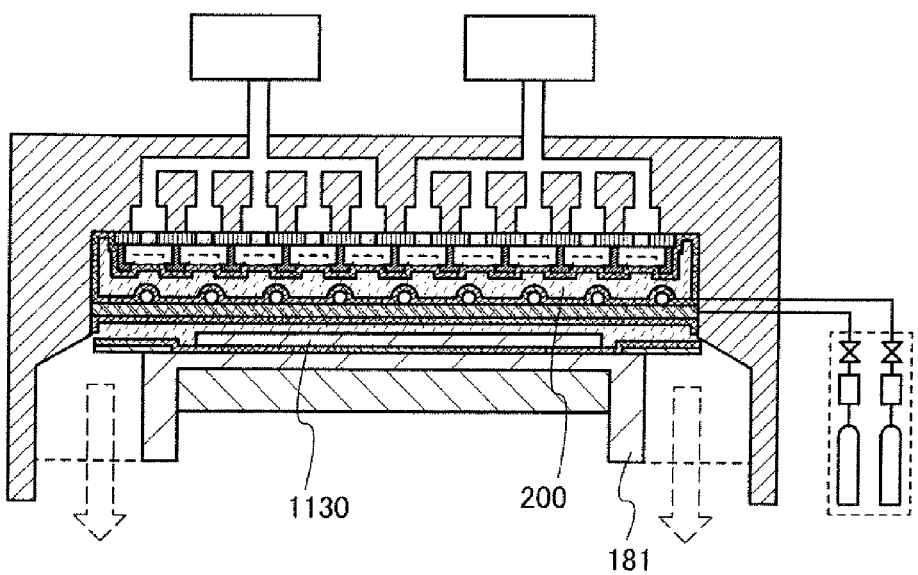

FIGS. 6A and 6B are used for describing a structure of one reaction chamber of such a microwave plasma CVD apparatus in detail. A gas supply portion 182 and a microwave generation device 184 are provided outside the reaction chamber.

The microwave generation device 184 supplies a microwave with a frequency of 1 GHz or higher, typically 2.45 GHz or 8.3 GHz. In the present invention, a plurality of microwave generation devices 184 are provided, so that stable large-sized plasma can be generated. Therefore, a film with high uniformity can be formed even over large-sized substrate whose one side exceeds 600 mm, particularly, exceeds 1000 mm, and the deposition rate can be increased.

A treatment container 180 has a sealed structure so that the inside can be kept under a reduced pressure. The treatment container 180 and a top plate 187 are formed of metal (e.g., an alloy containing aluminum) whose a surface is covered with an insulating film of alumina, silicon oxide, or a fluorine resin. Further, a fixing tool 188 is formed of metal, for example, an alloy containing aluminum.

In order to reduce the pressure inside of the reaction chamber, a vacuum pump is connected to the treatment container 180 through an exhaust port 183. The evacuation pump has a low vacuum evacuation unit and a high vacuum evacuation unit. The low vacuum evacuation unit makes a gating valve operate and evacuated in vacuum the reaction chamber from atmospheric air to about 0.1 Pa. The low vacuum evacuation unit is, for example, constituted by a dry pump. The high evacuation vacuum unit performs high vacuum evacuation of 0.1 Pa or lower, which is constituted by a turbo-molecular pump or the like. A pressure-adjustment valve that is connected to the high evacuation vacuum unit in series adjusts conductance of gas flow and operates to keep the inside of the reaction chamber under the pressure within the predetermined range by adjusting the exhaust velocity of a reaction gas supplied from the gas supply portion 182.

In the treatment container 180, a support 181 used for placing a substrate 1130 is provided. The support 181 is formed of a ceramic material such as aluminum nitride, silicon nitride, or silicon carbide. A temperature control portion 199 is provided on an inner side of the support 181, whereby the temperature of the substrate 1130 can be controlled. In addition, the support 181 may be provided with a power feeding portion that is connected to a high-frequency power supply. By providing the power feeding portion, a bias voltage can be applied to the substrate that is placed on the support 181.

A waveguide 185 connected to the microwave generation device 184 is provided in an upper part of the treatment container 180. The waveguide 185 introduces a microwave generated in the microwave generation device 184 to the treatment container 180. The top plate 187 that is in contact with the waveguide 185 and has openings 187a is provided, and a plurality of dielectric plates 186 are provided for the top plate 187 with use of the fixing tool 188.

The dielectric plates 186 are provided so as to be in close contact with the openings of the top plate 187. The microwave generated in the microwave generation device 184 is propagated to the dielectric plates 186 by passing through the waveguide 185 and the openings 187a of the top plate 187 and transmitted through the dielectric plates 186 to be released into the treatment container. By field effect energy of the microwave released into the treatment container, the non-source gas is excited into a plasma state. This plasma 200 has higher density on the surface of the dielectric plates 186; thus, damage to the substrate 1130 can be reduced. By provision of the plurality of dielectric plates 186, uniform large-sized plasma can be generated and kept. The dielectric plate 186 is formed of ceramics such as sapphire, quartz glass, alumina, silicon oxide, or silicon nitride. The dielectric plate 186 may have a recessed portion on the side where the plasma 200 is generated. Due to the recessed portion, stable plasma can be generated. By provision of the plurality of dielectric plates 186, a highly uniform film can be formed over a large-sized substrate whose one side exceeds 600 mm, particularly exceeds 1000 mm, and a deposition rate can be increased.

A gas pipe 197 through which the non-source gas flows and a gas pipe 198 through which a source gas flows are provided to intersect with each other. The nozzle of the gas pipe 197 is provided on the dielectric plates 186 side, and the nozzle of the gas pipe 198 is provided on the substrate 1130 side. By release of the non-source gas to the dielectric plates 186 side, the plasma 200 can be generated while formation of the film on the surface of the dielectric plates 186 is prevented. Further, the source gas can be released at a position which is closer to the substrate 1130, and a deposition rate can be increased. The gas pipes 197 and 198 are formed of ceramics such as alumina or aluminum nitride. Transmissivity of the microwaves is high in the ceramics; therefore, when the gas pipes 197 and 198 are formed of ceramics, distribution of the plasma can be uniform without an electric field being disturbed, even when the gas pipe is provided right under the dielectric plates 186.

The following will describe a process for forming a film. For this process, a gas supplied from the gas supply portion 182 may be selected for forming a desired film.

Here, a method for forming a silicon oxynitride film and a silicon nitride oxide film as a gate insulating film is given as an example.

First, the inside of the reaction chamber of the microwave plasma CVD apparatus is cleaned with fluorine radicals. The fluorine radicals are obtained by introducing carbon fluoride, nitrogen fluoride, or fluorine into a plasma generator provided outside the reaction chamber and dissociating the gas. By introducing the fluorine radicals into the reaction chamber, the reaction chamber can be cleaned.

Next, as shown in FIG. 6A, an oxynitride silicon film is deposited as a protective film 201, on surfaces of an inner wall of the treatment container 180 of the reaction chamber, the dielectric plates 186, the gas pipes 197 and 198, the support 181, and the like. Here, the pressure in the treatment container 180 is set from 1 to 200 Pa, preferably from 1 to 100 Pa, and at least one of rare gases of helium, argon, xenon, and krypton and an oxygen gas are introduced as plasma igniting gases to the treatment container 180. By introducing the oxygen gas with the rare gas into the treatment container 180, igniting plasma can be easily conducted. Next, a power supply of the microwave generation device 184 is turned on, and the plasma 200 is generated in such conditions that an output of the microwave generation device 184 is from 500 to 6000 W, preferably, from 4000 to 6000 W. Then, the source gas is introduced from the gas pipe 198 into the treatment container 180. Specifically, supply of the oxygen gas is stopped, and dinitrogen monoxide, a rare gas, and silane are introduced as a source gas, whereby a silicon oxynitride film is formed as the protective film 201 on the surfaces of the inner wall of the treatment container 180, the gas pipes 197 and 198, the dielectric plates 186, and the support 181. At this time, a flow rate of hydrogenated silicon is from 50 to 300 sccm, a flow rate of dinitrogen monoxide is from 500 to 6000 sccm, and a thickness of the protective film 201 is from 500 to 2000 nm.

Next, supply of the source gas is stopped, and the pressure in the treatment container 180 is reduced; thereafter, the power supply of the microwave generation device 184 is turned off. Then, as shown in FIG. 6B, the substrate 1130 is introduced over the support 181 in the treatment container 180.

Next, a silicon oxynitride film is deposited over the substrate by the similar step to that of the protective film.

After the silicon oxynitride film with a predetermined thickness is deposited, supply of a source gas is stopped, the pressure in the treatment container 180 is reduced, and the power supply of the microwave generation device 184 is turned off.

Next, the pressure in the treatment container 180 is set to be from 1 to 200 Pa, preferably from 1 to 100 Pa. At least one of rare gases of helium, argon, xenon, and krypton as a plasma ignition gas and source gases of silane, dinitrogen monoxide, and ammonia are introduced into the treatment container 180. Note that nitrogen may be introduced as a source gas instead of ammonia. Next, the power supply of the microwave generation device 184 is turned on, and the plasma 200 is generated in such conditions that the output of the microwave generation device 184 is from 500 to 6000 W, preferably from 4000 to 6000 W. The source gas is introduced into the treatment container 180 from the gas pipe 198, whereby a silicon nitride oxide film is formed over the silicon oxynitride film that is provided over the substrate 1130. After that, supply of the source gas is stopped, the pressure in the treatment container 180 is reduced, and the power supply of the microwave generation device 184 is turned off, so that the film formation process is completed.

Through the above steps, the silicon oxynitride film is formed as the protective film on the inner wall of the reaction chamber, and the silicon oxynitride film and the silicon nitride oxide film are successively formed over the substrate, so that mixing an impurity such as silicon oxide into the silicon nitride oxide film that is the upper layer of the gate insulating film can be suppressed. Since the film has high withstand voltage, variation in threshold voltages of transistors can be reduced when the film is used as the gate insulating film. In addition, a BT (bias-temperature) characteristic can be increased. Further, withstand against static electricity is increased, so that a transistor that is hardly damaged even when a high voltage is applied thereto can be manufactured. Further, a transistor that is hardly damaged over time can be manufactured. Furthermore, a transistor that is hardly damaged due to hot carriers can be manufactured.

In a case where a single layer of a silicon oxynitride film is provided as the gate insulating film, the above-mentioned method for forming the protective film and the above-mentioned method for forming a silicon oxynitride film are used. In particular, when the flow rate of silane/dinitrogen monoxide is greater than or equal to 1/100 and less than or equal to 1/300, preferably, greater than or equal to 1/150 and less than or equal to 1/250, a silicon oxynitride film with high withstand voltage can be formed.

When a microwave plasma CVD apparatus with a frequency of 1 GHz or higher is used, the kinds of and flow rate of source gases can be more reduced as compared with a case of using a parallel-plate plasma CVD apparatus having a frequency of lower than 1 GHz. Typically, in a case where a silicon nitride film is formed, the gas flow rates of silane and nitrogen needed for formation of the silicon nitride film are 50 sccm and 5000 sccm, respectively, in a parallel-plate plasma CVD apparatus of 27.12 MHz whereas the gas rates of silane and nitrogen are 100 sccm and 300 sccm, respectively, in a microwave plasma CVD apparatus of 2.45 GHz shown in FIGS. 6A and 6B. In other words, by using a microwave plasma CVD apparatus with a frequency of 1 GHz or higher, the amount of source gases can be reduced.

Next, a film-formation treatment method of a microcrystalline semiconductor film by a microwave plasma CVD method is shown. First, the reaction chamber is cleaned, similarly to the case of the gate insulating film. Then, a silicon film as a protective film is deposited in the treatment container 180. Here, the pressure in the treatment container is set from 1 to 200 Pa, preferably, from 1 to 100 Pa, and at least one of rare gases of helium, argon, xenon, and krypton is introduced as a plasma ignition gas. Next, the power supply of the microwave generation device 184 is turned on, and the plasma 200 is generated in such conditions that the output of the microwave generation device 184 is set to be from 500 to 6000 W, preferably, from 4000 to 6000 W. After that, a source gas is introduced into the treatment container 180 from the gas pipe 198. Specifically, a silicon compound gas and further a hydrogen gas are introduced as source gases, so that a microcrystalline silicon film or an amorphous semiconductor film is formed as a protective film 201 on surfaces of the inner wall of the treatment container 180, the gas pipes 197 and 198, the dielectric plate 186, and the support 181. A thickness of the protective film at this time is from 500 to 2000 nm.

Next, supply of the source gas is stopped, the pressure of the treatment container 180 is reduced, and the power supply of the microwave generation device 184 is turned off. After that, the substrate 1130 is introduced over the support 181 in the treatment container 180 as shown in FIG. 6B.

Next, a microcrystalline silicon film is deposited over the substrate by the similar step of the case to the protective film.

After the microcrystalline silicon is deposited with a predetermined thickness, supply of the source gas is stopped, the pressure in the treatment container 180 is reduced, and the power supply of the microwave generation device 184 is turned off, so that the film-formation process is completed.

Plasma generated by the microwave plasma CVD apparatus with a frequency of 1 GHz or higher has high electron density, and a large amount of radicals are formed from the source gas to be supplied to the substrate 1130. Thus, surface reaction of the radicals on the substrate is promoted, and the deposition rate of the microcrystalline silicon can be increased. Further, by use of the microwave plasma CVD apparatus provided with a plurality of microwave generation devices and dielectric plates, stable large-sized plasma can be generated. Therefore, a film whose quality is highly uniform can be formed over a large-sized substrate, and mass productivity can be increased.

In each process for manufacturing the gate insulating film and the semiconductor film, if the protective film with a thickness of 500 to 2000 nm is formed on the inner wall of the reaction chamber, the cleaning treatment and the treatment for forming a protective film can be omitted.

Further, by mixing a rare gas such as argon for igniting plasma and keeping the plasma, separation of the source gas and formation of radicals can be efficiently performed by excited spices of the rare gas.

Next, masks 56 and 57 are formed over the semiconductor film 55 to which an impurity imparting one conductivity type is added. The semiconductor film 54 and the semiconductor film 55 to which an impurity imparting one conductivity type is added are etched to be separated into island shapes. Consequently, semiconductor films 60 and 61 and semiconductor films 58 and 59 to which an impurity imparting one conductivity type is added are formed as shown in FIG. 1B.

After that, source and drain electrodes 62 to 65 are formed over the semiconductor films 58 and 59 to which an impurity imparting one conductivity type is added and the gate insulating film 53b. The source and drain electrodes 62 to 65 are preferably formed using aluminum; an element to improve resistance to heat such as copper, silicon, titanium, neodymium, scandium, or molybdenum; or an aluminum alloy to which an element which prevents hillocks is added. Alternatively, a layer in contact with the semiconductor film to which an impurity imparting one conductivity type is added may be formed of titanium, tantalum, molybdenum, or tungsten, or nitride of such an element, and aluminum or an aluminum alloy may be formed thereover to form a stacked-layer structure. Further alternatively, top and bottom surfaces of aluminum or an aluminum alloy may be each covered with titanium, tantalum, molybdenum, tungsten, or nitride thereof to form a stacked-layer structure.

The source and drain electrodes 62 to 65 can be formed as follows: a conductive film is formed over the semiconductor films 58 and 59 to which an impurity imparting one conductivity type is added and the gate insulating film 53b by a sputtering method or a vacuum evaporation method; a mask is formed over the conductive film by a photolithography technique or a coating method; and the conductive film is etched using the mask. The source and drain electrodes 62 to 65 may also be formed by discharging a conductive nanopaste of silver, gold, copper, or the like by a screen printing method, an ink-jet method, or the like and baking it.

Next, as shown in FIG. 1C, the semiconductor films 58 and 59 to which an impurity imparting one conductivity type is added are etched using the source and drain electrodes 62 to 65 as masks or using a mask for forming the source and drain electrodes 62 to 65, which is not illustrated, so that source and drain regions 66 to 69 are formed. In this step, since etching selectivity with respect to the semiconductor films 60 and 61 which functions as a base is not high, the semiconductor films 60 and 61 are also slightly etched, whereby semiconductor films 70 and 71 which function as channel formation regions are formed.

Through the above process, channel etched thin film transistors 72 and 73 can be formed. With the channel etched thin film transistor, the number of manufacturing steps can be reduced and the cost can be reduced. In addition, by formation of the channel formation region using a semiconductor film, a field effect mobility of 2 to 10 cm$^2$/V·sec can be obtained. Therefore, these thin film transistors can be used as a switching element of a pixel in a pixel portion 88 and an element included in a driver circuit 89 on a scanning line (gate line) side.

Figure 2:
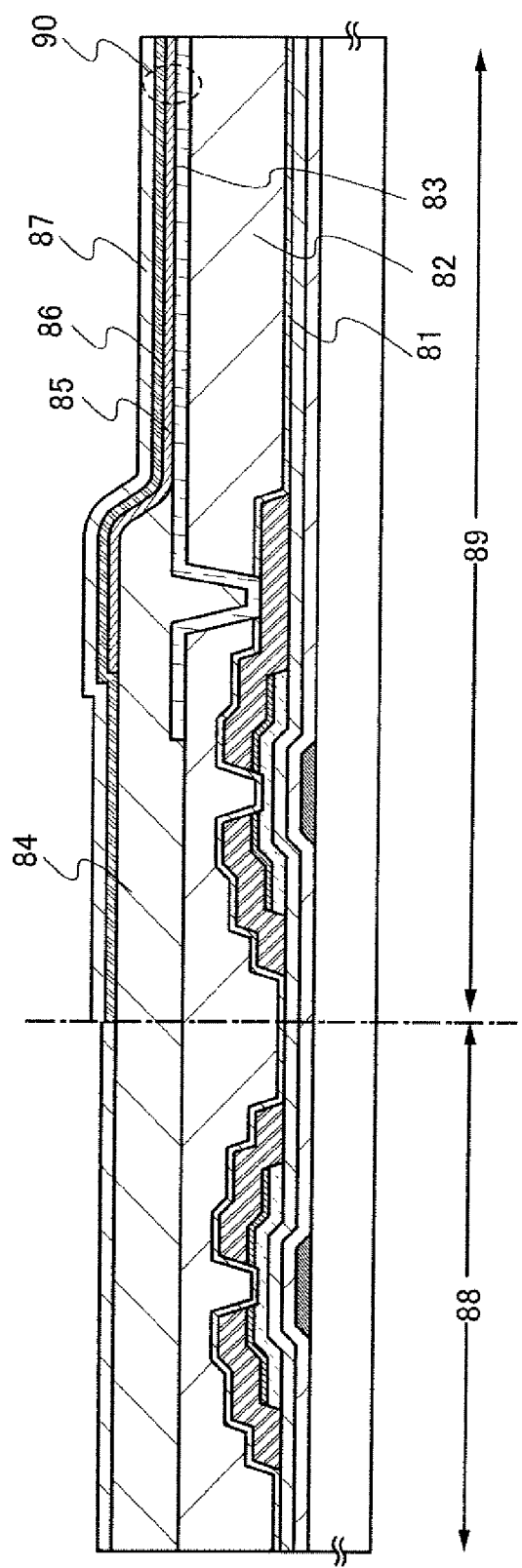
FIG. 2 is a cross-sectional view describing a method for manufacturing a semiconductor device of the present invention.
Figure 3:
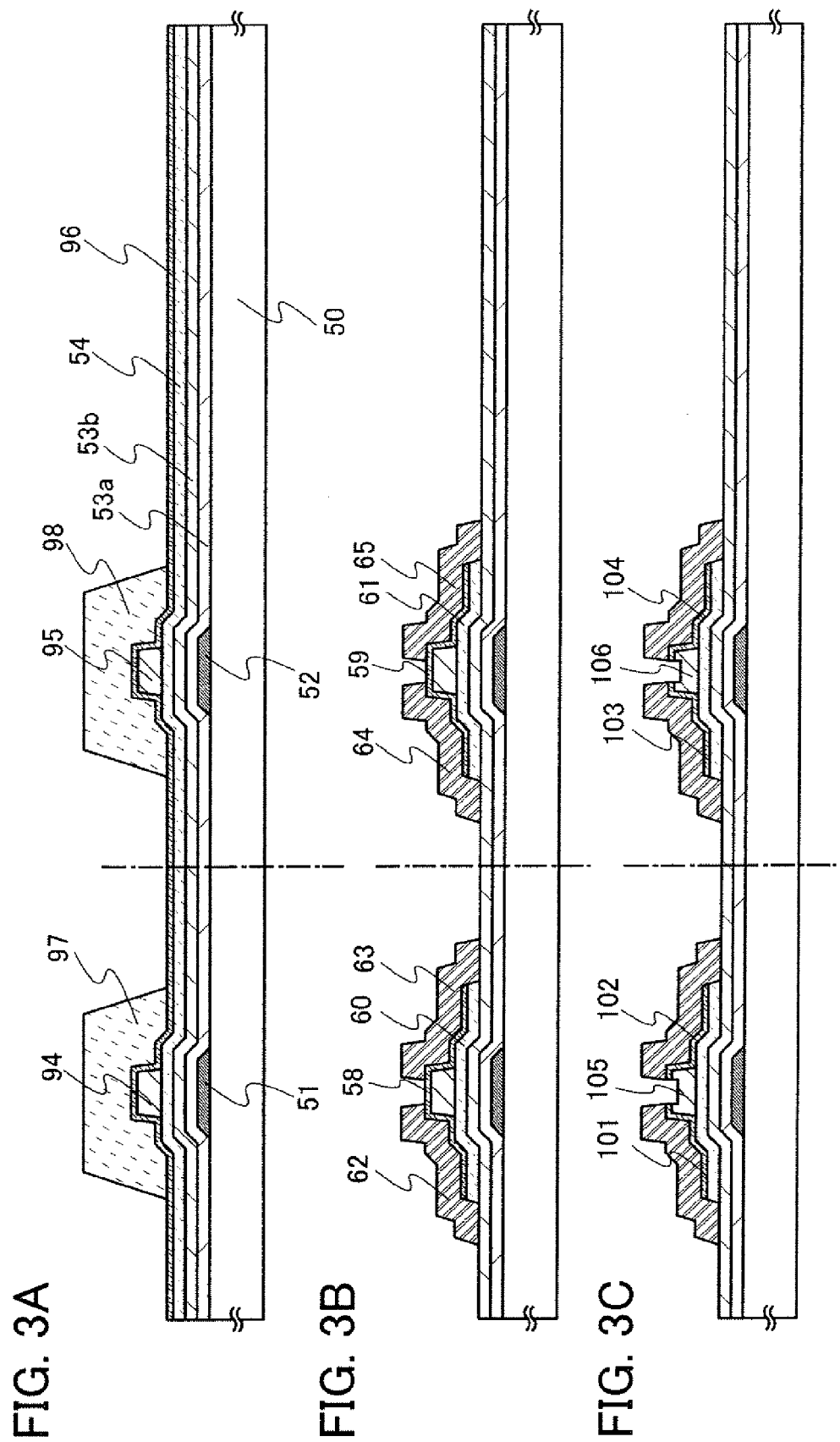
FIGS. 3A to 3C are cross-sectional views describing a method for manufacturing a semiconductor device of the present invention.

Next, as shown in FIG. 2, an insulating film 81 is formed over the thin film transistors 72 and 73 in order to protect the channel formation regions; a planarizing film 82 having a contact hole is preferably formed over the insulating film 81; and a pixel electrode 83 in contact with the source or drain electrode through the contact hole is formed over the planarizing film 82.

The insulating film 81 can be formed in a similar manner to the gate insulating films 53a and 53b. The insulating film 81 is provided to prevent a contamination impurity such as an organic substance or a metal contained in atmospheric air, or moisture from entering and is preferably a dense film. By formation of the insulating film 81 using a silicon nitride film, the oxygen concentration in the semiconductor films 70 and 71 functioning as channel formation regions can be set at $5 \times 10^{19}$ atoms/cm$^3$ or lower, preferably $1 \times 10^{19}$ atoms/cm$^3$ or lower.

The planarizing film 82 is preferably an insulating film formed of an organic resin such as acrylic, polyimide, or polyamide, or siloxane.

In FIG. 2, a cathode is preferably used for the pixel electrode 83 because the thin film transistor in the pixel is n-type. In the case where the thin film transistor in the pixel is p-type, an anode is preferably used. Specifically a known material having a low work function such as Ca, Al, CaF, MgAg, or AlLi can be used as a cathode.

Next, a partition wall 84 is formed over the planarizing film 82 and an end portion of the pixel electrode 83. The partition wall 84 has an opening and the pixel electrode 83 is exposed in the opening. The partition wall 84 is formed using an organic resin film, an inorganic insulating film, or organic polysiloxane. The partition wall 84 is formed of a photosensitive material, and the opening is formed over the pixel electrode so that a side wall of the opening forms an inclined surface with a continuous curvature, which is preferable.

Then, a light-emitting layer 85 is formed to be in contact with the pixel electrode 83 in the opening of the partition wall 84. The light-emitting layer 85 may be formed using a single layer or by stacking a plurality of layers.

Then, a common electrode 86 is formed of an anode material so as to cover the light-emitting layer 85. The common electrode 86 can be formed of a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added. The common electrode 86 can be formed using a titanium nitride film or a titanium film as well as the above light-transmitting conductive films. In FIG. 2, the common electrode 86 is formed of ITO. In the opening of the partition wall 84, the pixel electrode 83, the light-emitting layer 85, and the common electrode 86 overlap with one another, so that a light-emitting element 90 is formed. After that, a protective film 87 is preferably formed over the common electrode 86 and the partition wall 84 so that oxygen, hydrogen, moisture, carbon dioxide, or the like does not enter the light-emitting element 90. As the protective film 87, a silicon nitride film, a silicon nitride oxide film, a DLC (diamond like carbon) film, or the like can be formed.

Further, in a practical case, it is preferable that a light-emitting device completed to the state illustrated in FIG. 2 be packaged (sealed) with a protective film (such as a laminated film or an ultraviolet curable resin film) or a cover material having high air-tightness and less degasification so that the light-emitting device is not exposed to the outside air.

Although FIGS. 1A to 2 show the method for manufacturing a light-emitting device having channel etched thin film transistors, the light-emitting device can also be formed using channel protective thin film transistors. A manufacturing method thereof will be described with reference to FIGS. 3A to 3C.

As shown in FIG. 3A, gate electrodes 51 and 52 are formed over a substrate 50. Next, gate insulating films 53a and 53b are formed over the gate electrodes 51 and 52, and then a semiconductor film 55 is formed thereover.

Next, channel protective films 94 and 95 are formed over the semiconductor film 54 so as to overlap with the gate electrodes 51 and 52, respectively. The channel protective films 94 and 95 can be formed as follows: an insulating film is formed over the semiconductor film 54 using silicon nitride, silicon nitride oxide, silicon oxide, or silicon oxynitride by a sputtering method, a CVD method, or the like; a mask is formed over the insulating film; and the insulating film is etched using the mask. Further, the channel protective films 94 and 95 can also be formed by discharging a composition containing polyimide, acrylic, or siloxane and baking it.

Then, a semiconductor film 96 to which an impurity imparting one conductivity type is added is formed over the channel protective films 94 and 95, and masks 97 and 98 are formed over the semiconductor film 96 to which an impurity imparting one conductivity type is added. The semiconductor film 96 can be formed in a similar manner to the semiconductor film 55 to which an impurity imparting one conductivity type is added shown in FIG. 1A. The masks 97 and 98 can be formed in a similar manner to the masks 56 and 57 shown in FIG. 1B.

The semiconductor film 96 to which an impurity imparting one conductivity type is added and the semiconductor film 54 are etched to be separated using the masks 97 and 98, so that semiconductor films 60 and 61 functioning as channel formation regions and semiconductor films 58 and 59 to which an impurity imparting one conductivity type is added are formed as shown in FIG. 3B.

Next, source and drain electrodes 62 to 65 are formed over the semiconductor films 58 and 59 to which an impurity imparting one conductivity type is added and the gate insulating film 53b.

Then, as shown in FIG. 3C, the semiconductor films 58 and 59 to which an impurity imparting one conductivity type is added are etched using the source and drain electrodes 62 to 65 as masks, so that the source and drain regions 101 to 104 are formed. At this time, the channel protective films 94 and 95 are partly etched.

Through the above process, a channel protective thin film transistor including the gate electrode 51 and the channel protective film 105 which overlaps with the semiconductor film 60, and a channel protective thin film transistor including the gate electrode 52 and the channel protective film 106 which overlaps with the semiconductor film 61 can be manufactured. By formation of the channel protective thin film transistors over an element substrate, variations in element characteristics of the thin film transistors can be reduced and off current can be reduced. Further, by formation of the channel formation region using the semiconductor film, a field effect mobility of 2 to 10 $cm^2/V \cdot sec$ can be obtained. Therefore, these thin film transistors can be used for a switching element of a pixel in a pixel portion 88 and an element included in a driver circuit 89 on a scanning line (or gate line) side.

Next, a method for manufacturing a liquid crystal display device as a display device will be described with reference to FIGS. 1A to 2 and FIG. 4. A thin film transistor is used as a semiconductor element also here for description.

Figure 4:
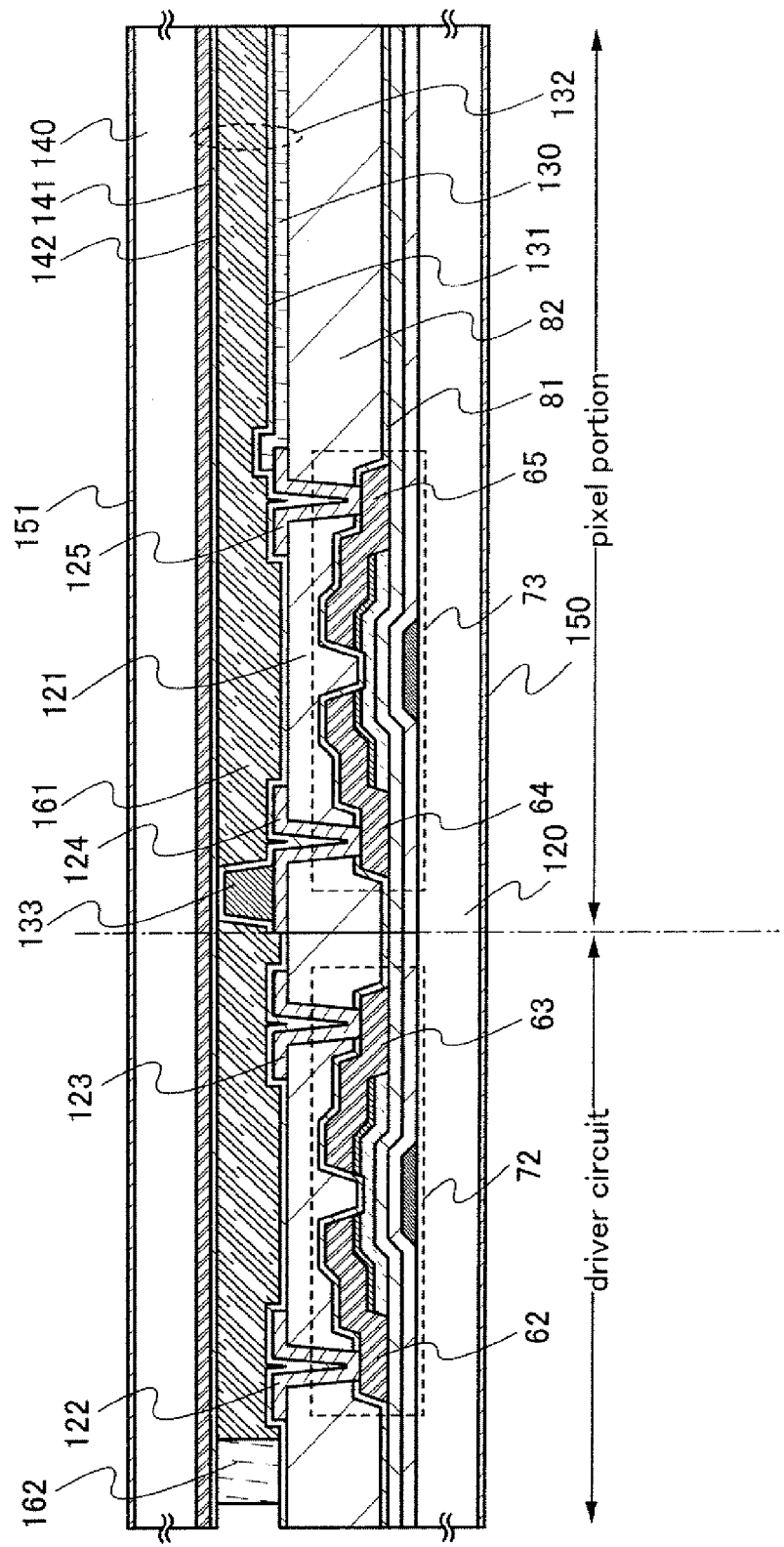
FIG. 4 is a cross-sectional view describing a method for manufacturing a semiconductor device of the present invention.

Through the manufacturing steps shown in FIGS. 1A to 1C, the thin film transistors 72 and 73 are formed over a first substrate 120 as shown in FIG. 4. Then, over the thin film transistors 72 and 73, an insulating film 81 functioning as a protective film, a planarizing film 82, and wirings 122 to 125 which are in contact with source and drain electrodes 62 to 65 of the thin film transistors 72 and 73, respectively, are formed. Next, a pixel electrode 130 connected to the wiring 125 is formed over the planarizing film 82.

In this embodiment mode, an example in which a transmissive liquid crystal display device is manufactured by forming the pixel electrode 130 using a transparent conductive film is shown; however, the liquid crystal display device of the present invention is not limited to this structure. By formation of the pixel electrode using a conductive film which can easily reflect light, a reflective liquid crystal display device can be formed. In that case, part of the wiring 125 can be used as the pixel electrode.

Next, a spacer 133 is formed over the wiring 124 or 125 using an insulating film. FIG. 4 illustrates an example in which the spacer 133 is formed over the wiring 124 using silicon oxide. There is no particular limitation on the order of forming the pixel electrode 130 and the spacer 133. Although a columnar spacer is formed as the spacer 133 in this embodiment mode, bead spacers may also be dispersed.

Then, an alignment film 131 is formed so as to cover the wirings 122 to 125, the spacer 133, and the pixel electrode 130, and rubbing treatment is performed to the alignment film 131.

Next, a sealant 162 for sealing liquid crystal is formed. Meanwhile, a second substrate 140 provided with a counter electrode 141 formed using a transparent conductive film and an alignment film 142 to which rubbing treatment is performed is prepared. Then, liquid crystal 161 is dripped to a region surrounded by the sealant 162, and the separately prepared second substrate 140 is attached to the first substrate 120 using the sealant 162 such that the counter electrode 141 and the pixel electrode 130 face each other. Note that a filler may be mixed in the sealant 162.

Alternatively, the sealant 162 may be provided for the second substrate 140, the liquid crystal 161 may be dripped to a region surrounded by the sealant 162, and then, the first substrate 120 and the second substrate 140 are attached to each other using the sealant 162.

A dispenser method (a dripping method) is used for injecting the liquid crystal; however, the present invention is not limited thereto. A dipping method (pumping method) in which the liquid crystal is injected using a capillary phenomenon after attaching the first substrate 120 and the second substrate 140 to each other using the sealant 162 may also be used.

Note that a color filter, a light-blocking film for preventing disinclination (a black matrix), or the like may also be provided for the first substrate 120 or the second substrate 140. Further, a polarizing plate 150 is attached to a surface of the first substrate 120 which is opposite to the surface provided with the thin film transistor, and a polarizing plate 151 is attached to a surface of the second substrate 140 which is opposite to the surface provided with the counter electrode 141.

As a transparent conductive film for the pixel electrode 130 or the counter electrode 141, a material similar to that for an anode of the pixel electrode shown in FIG. 2B can be used as appropriate. A liquid crystal element 132 corresponds to a region where the pixel electrode 130 and the counter electrode 141 sandwich the liquid crystal 161.

Accordingly, a display device can be manufactured. In this embodiment mode, before the gate insulating film is formed, the inner wall of the reaction chamber of the plasma CVD apparatus is coated with a film that does not include an impurity to the gate insulating film. Thus, mixing an impurity into the gate insulating film can be suppressed. Therefore, deterioration in characteristics of the semiconductor element formed using the gate insulating film can be avoided. Further, a semiconductor device can be manufactured with high yield. Furthermore, the gate insulating film and the semiconductor film are formed using the microwave plasma CVD apparatus with a frequency of 1 GHz or higher. Since plasma generated by the microwave plasma CVD apparatus has high electron density, the deposition rate can be increased by using the apparatus. Therefore, the use of the microwave plasma CVD apparatus can increase productivity of a display device including a thin film transistor. Further, a microwave plasma CVD apparatus constituted by a plurality of microwave generation devices and a plurality of dielectric plates can produce stable large-sized plasma. Therefore, a display device can be manufactured using a large-sized substrate, so that productivity can be increased.

Note that a light-emitting device shown in this embodiment mode is not limited to the structure shown in FIG. 2, and a liquid crystal display device shown in this embodiment mode is not limited to the structure shown in FIG. 4. The light-emitting device and the liquid crystal display device shown in this embodiment mode can be modified in various ways based on a technical idea of the present invention.

Embodiment Mode 2

A semiconductor device of this embodiment mode will be described with reference to FIGS. 7A to 9. This embodiment shows a manufacturing step of a semiconductor device that is manufactured using the SOI substrate. Note that a semiconductor device using a semiconductor substrate instead of the SOI substrate can be applied in this embodiment mode.

Figure 7A:
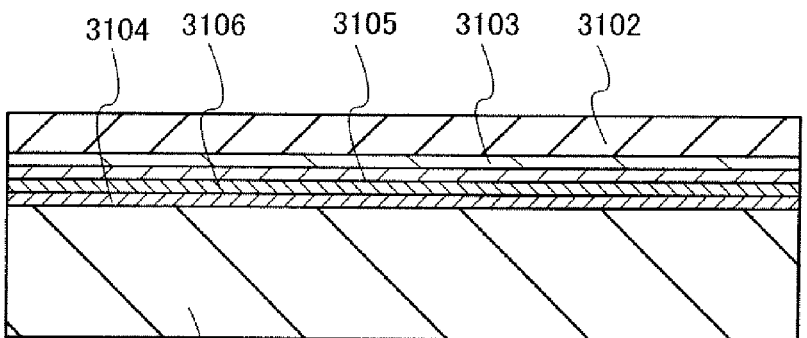
FIGS. 7A to 7D are cross-sectional views describing a method for manufacturing a semiconductor device of the present invention.

In FIG. 7A, an SOI substrate is shown, in which a single crystalline semiconductor layer 3102 is provided over a support substrate 3101, and an insulating film 3103 containing halogen, a relaxation film 3105, a barrier film 3106, and a bonding layer 3104 are provided between the single crystalline semiconductor layer 3102 and the support substrate 3101. In the description below, such a stack structure used for an SOI substrate is described, but the stack order of the relaxation film 3105, the barrier film 3106 and the bonding layer 3104 can be different as appropriate.

The thickness of the single crystalline semiconductor layer 3102 is from 5 to 500 nm, preferably from 10 to 200 nm, and more preferably 10 to 60 nm. To the single crystalline semiconductor layer 3102, a p-type impurity such as boron, aluminum, or gallium or an n-type impurity such as phosphorus or arsenic is preferably added to correspond to a formation region of an n-channel field-effect transistor or a p-channel field-effect transistor. In other words, a p-type impurity is added to a formation region of an n-channel field-effect transistor or an n-type impurity is added to a formation region of a p-channel field-effect transistor, whereby a so-called well region is formed. The dose of impurity ions may be approximately $1 \times 10^{12}$ to $1 \times 10^{14}$/cm$^2$. Furthermore, in the case of controlling the threshold voltage of the field-effect transistor, a p-type or n-type impurity may be added to the well region.

Figure 7B:
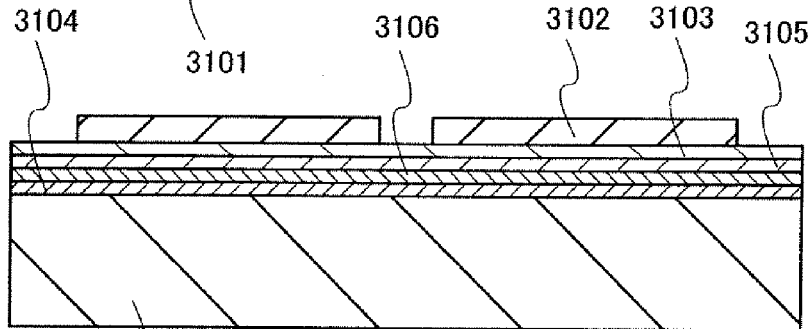
Figure 7C:
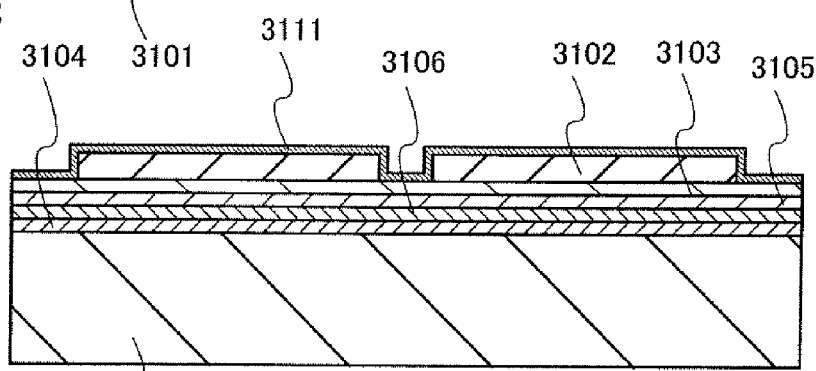
Figure 7D:
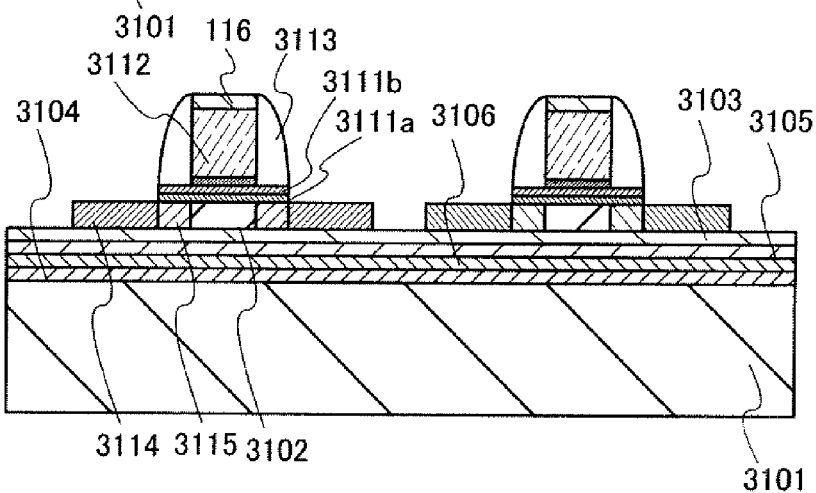

Then, as shown in FIG. 7B, the single crystalline semiconductor layer 3102 is etched to form single crystalline semiconductor layers 3102 which are isolated in island shapes from each other to correspond to the arrangement of semiconductor elements. As shown in FIG. 7C, a gate insulating film 3111 is formed. The gate insulating film is formed to have a thickness of from 5 to 50 nm by a microwave CVD method. The gate insulating film can be formed of a silicon nitride film, a silicon oxynitride film, or a silicon nitride oxide film by such a method as described in Embodiment Mode 1. Alternatively, a stacked layer of a silicon oxynitride film and a silicon nitride film or a stacked layer of a silicon oxynitride film and a silicon nitride oxide film may be employed. In this embodiment mode, as the gate insulating film, a silicon oxynitride film 3111a and a silicon nitride oxide film 3111b are formed in succession by a microwave CVD apparatus as shown in FIG. 5.

As a forming step of the gate insulating film, as similarly to Embodiment Mode 1, a protective film is formed on an inner wall of a reaction chamber of the microwave plasma CVD apparatus before the formation step, and thus a gate insulating film in which few impurities are included can be formed over the support substrate 3101 and the single crystalline semiconductor layer 3102.

By such a microwave plasma CVD apparatus by which high density plasma is generated, the gate insulating film 3111 is formed, then as shown in FIG. 79, a gate electrode 3112, a sidewall insulating film 3113, a first impurity region 3114, and a second impurity region 3115 are formed. The insulating film 3116 is formed of silicon nitride, and is used as a hard mask so as not to etch the gate electrode 3112 in forming the sidewall.

Figure 8A:
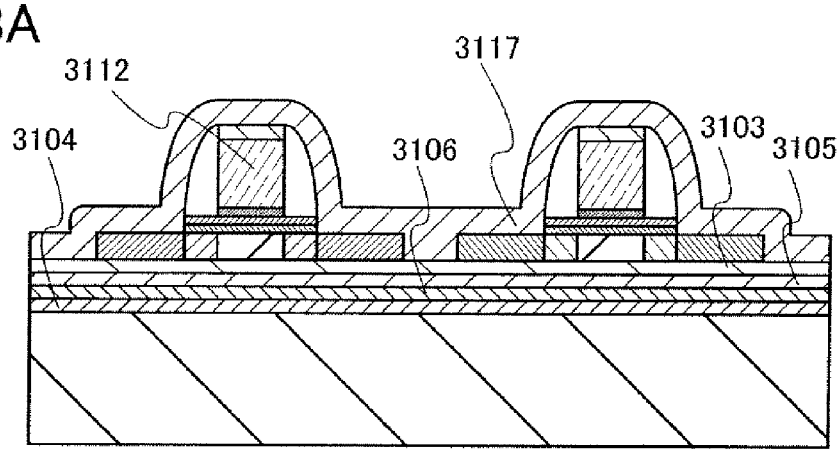
FIGS. 8A to 8C are cross-sectional views describing a method for manufacturing a semiconductor device of the present invention.

FIG. 8A shows a mode in which a protective film 3117 is formed after forming the gate electrode 3112 and the like. As the protective film 3117, a silicon nitride film or a silicon nitride oxide film is preferably formed by a plasma CVD method at a substrate temperature of 350° C. or lower during film formation. In other words, the protective film 3117 is made to contain hydrogen. After the protective film 3117 is formed, hydrogen contained in the protective film 3117 is diffused into the single crystalline semiconductor layer side by thermal treatment at 350° C. to 450° C. preferably, 400° C. to 420° C.). By supply of hydrogen, during an element formation step, to the single crystalline semiconductor layer, which has been dehydrogenated in the previous step, defects can be compensated effectively. In addition, the barrier film 3106 prevents impurity diffusion from the support substrate 3101 side, whereas the protective film 3117 is effective in preventing impurity contamination from the upper layer side. In this embodiment mode, an upper layer side and a lower layer side of the single crystalline semiconductor layer having excellent crystallinity are covered with insulating films which are highly effective in preventing even highly mobile impurity ions of sodium or the like. Therefore, a great effect in stabilizing the characteristics of a semiconductor element manufactured using the single crystalline semiconductor layer 3102 is obtained.

Figure 8B:
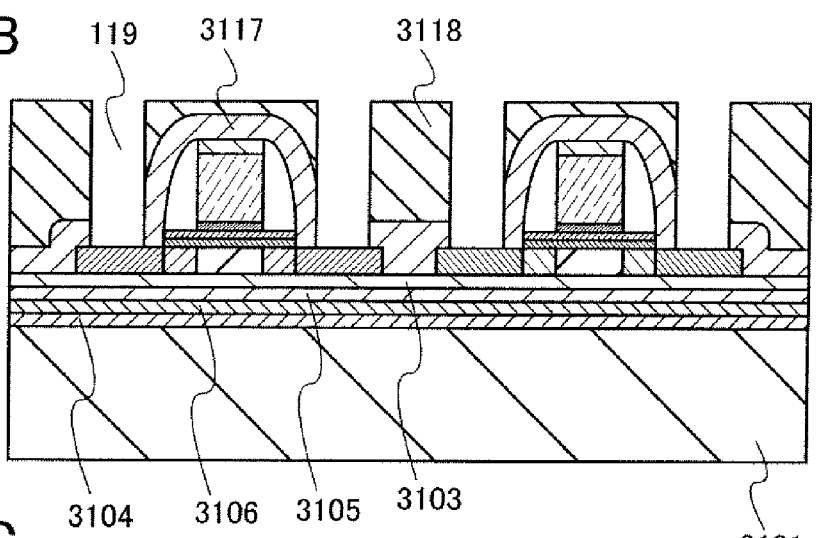

Then, an interlayer insulating layer 3118 is formed as shown in FIG. 8B. As the interlayer insulating film 3118, a BPSG (boron phosphorus silicon glass) film is formed or an organic resin typified by polyimide is formed by coating. In the interlayer insulating film 3118, a contact hole 119 is formed.

Figure 8C:
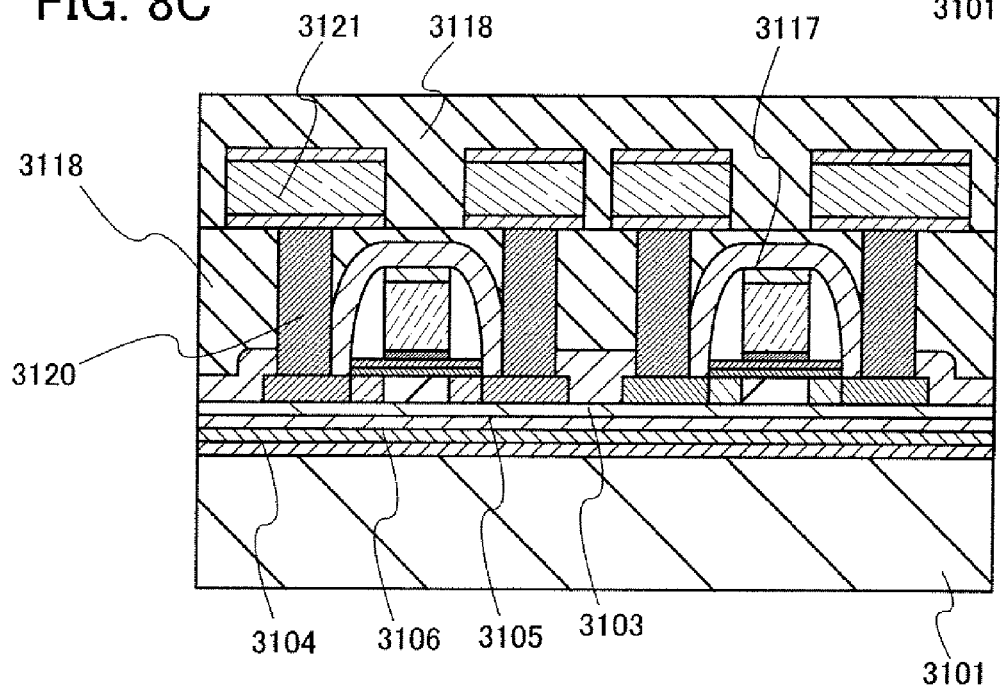

FIG. 8C shows a mode of forming a wiring. In the contact hole 3119, a contact plug 3120 is formed. As the contact plug 3120, tungsten silicide is formed by a chemical vapor deposition method from a $WF_6$ gas and a $SiH_4$ gas to fill the contact hole 3119. Alternatively, tungsten may be formed by hydrogen reduction of $WF_6$ to fill the contact hole 3119. Then, a wiring 3121 is formed so as to correspond to a contact plug 3120. Then, the wiring 3121 formed in accordance with the contact plug 3120. The wiring 3121 is formed using aluminum or an aluminum alloy, and metal films of molybdenum, chromium, titanium, or the like are formed as barrier metals in an upper layer and a lower layer of the wiring. Further, an interlayer insulating film 3122 is formed over the barrier metal. The wiring 3121 may be provided as appropriate and another wiring layer may be formed over the wiring 3121 to form a multilayer. In that case of the multilayer, a damascene process may be employed.

Figure 9:
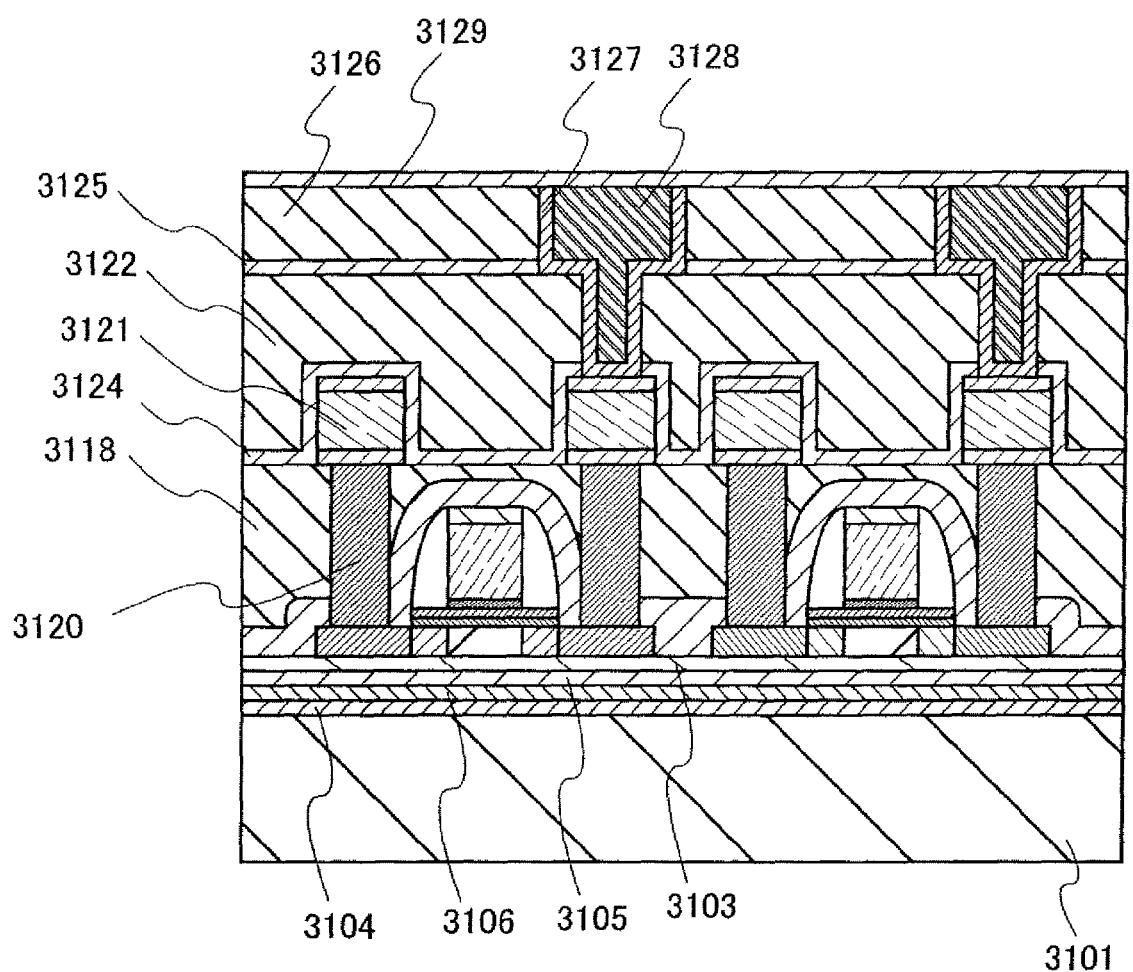
FIG. 9 is a cross-sectional view describing a method for manufacturing a semiconductor device of the present invention.

FIG. 9 illustrates a mode in which a wiring is formed over the interlayer insulating film 3122 to form a multilayer wiring.

Over the wiring 3121, a passivation film 3124 is formed using a silicon nitride film and the interlayer insulating film 3122 is formed. Further, a passivation film 3125 and an insulating film between wirings (an interwiring insulating film 3126) are formed. The barrier metal 3127 is formed using tantalum or tantalum nitride. A copper wiring 3128 is formed by a plating method, and the copper wiring 3128 is embedded in the interwiring insulating film 3126 by a chemical mechanical polishing (CMP) method, and a passivation film 3129 is formed thereover of silicon nitride. The wiring provided in the upper layer can be formed by a damascene method or a dual damascene method, for example. The number of stacked layers for wirings is optional and may be determined as appropriate.

In this manner, a field effect transistor can be manufactured using the single crystalline semiconductor layers 3102 that are bonded to the support substrate 3101. The single crystalline semiconductor layer 3102 according to this embodiment mode is formed of a single crystal semiconductor that has uniform crystal orientation; therefore, a high-performance field-effect transistor with uniform electric characteristics can be obtained. In other words, it is possible to suppress inhomogeneity of values of important transistor electric characteristics, such as threshold voltage and mobility, and to achieve higher performance such as higher mobility.

In addition, the insulating film 3103 containing halogen is provided on the back channel side (the side opposite to a gate electrode 3112) of the single crystalline semiconductor layer 3102, and local level density is decreased; therefore, variation in threshold voltage between transistors can be suppressed.

Further, between the support substrate 3101 and the single crystalline semiconductor layer 3102, a barrier film 3106 is formed in addition to the insulating film 3103 that contains halogen. Thus, the single crystalline semiconductor layer 3102 can be prevented from being contaminated by diffusion of metal impurities such as sodium from the support substrate 3101 side. The relaxation film 3105 can ease distortion due to stress applied to the single crystalline semiconductor layer 3102, and generation of defects in stacking wirings can be suppressed.

Figure 10:
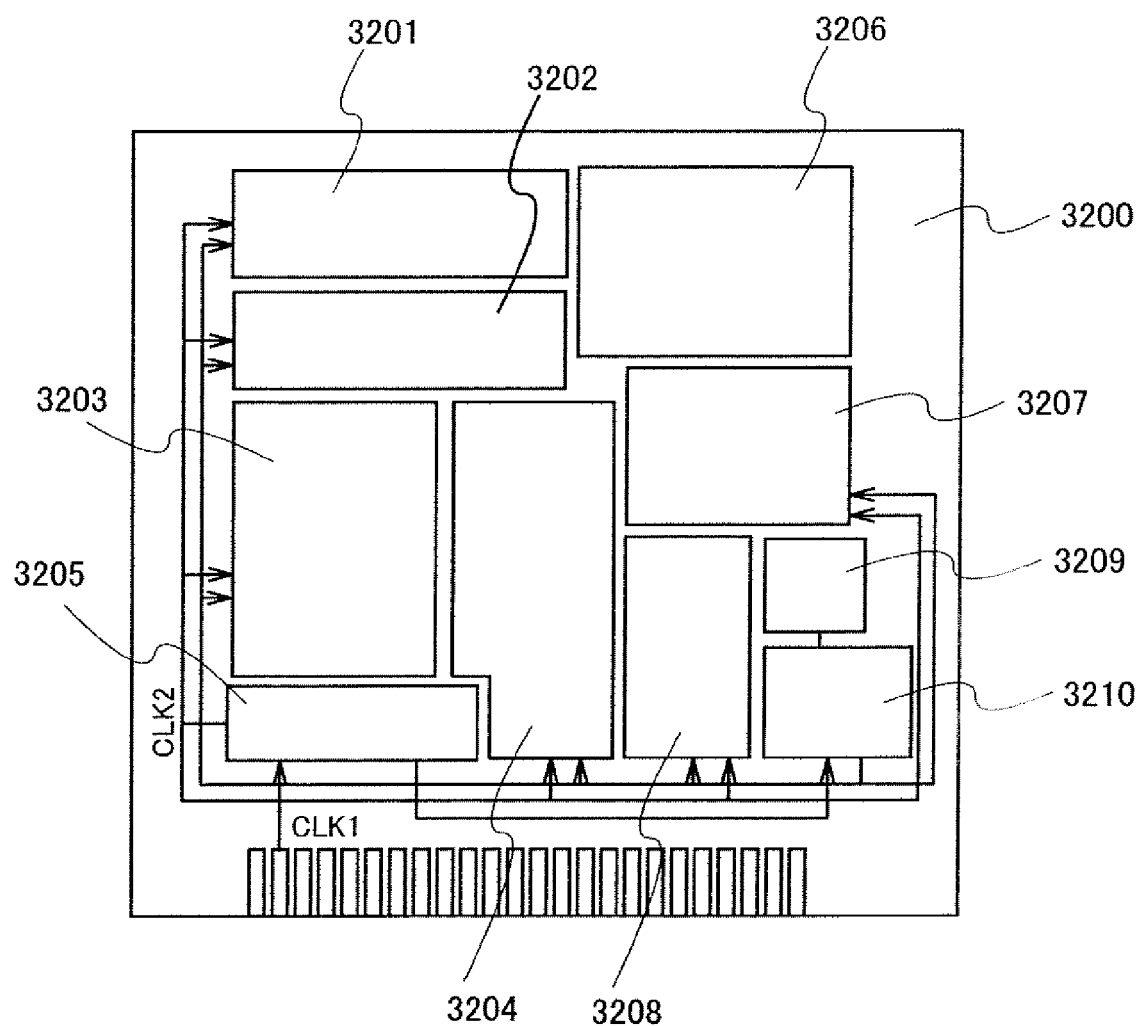
FIG. 10 is a block diagram describing a structure of a microprocessor that is obtained by a semiconductor device of the present invention.

FIG. 10 shows an example of a microprocessor 3200 as an example of a semiconductor device. The microprocessor 3200 is manufactured using the semiconductor substrate of this embodiment mode as described above. This microprocessor 3200 has an arithmetic logic unit (ALU) 3201, an ALU controller 3202, an instruction decoder 3203, an interrupt controller 3204, a timing controller 3205, a register 3206, a register controller 3207, a bus interface (Bus I/F) 3208, a read-only memory (ROM) 3209, and a ROM interface (ROM I/F) 3210.

An instruction input to the microprocessor 3200 through the bus interface 3208 is input to the instruction decoder 3203, decoded therein, and then input to the ALU controller 3202, the interrupt controller 3204, the register controller 3207, and the timing controller 3205. The ALU controller 3202, the interrupt controller 3204, the register controller 3207, and the timing controller 3205 conduct various controls based on the decoded instruction. Specifically, the ALU controller 3202 generates signals for controlling the operation of the ALU 3201. While the microprocessor 3200 is executing a program, the interrupt controller 3204 processes an interrupt request from an external input/output device or a peripheral circuit based on its priority or a mask state. The register controller 3207 generates an address of the register 3206, and reads/writes data from/to the register 3206 in accordance with the state of the microprocessor 3200. The timing controller 3205 generates signals for controlling timing of operation of the ALU 3201, the ALU controller 3202, the instruction decoder 3203, the interrupt controller 3204, and the register controller 3207. For example, the timing controller 3205 is provided with an internal clock generator for generating an internal clock signal CLK2 based on a reference clock signal CLK1, and supplies the internal clock signal CLK2 to the above-described circuits. Note that the microprocessor 3200 illustrated in FIG. 10 is only one example in which the configuration is illustrated simply, and an actual microprocessor may have a variation of configurations depending on the uses.

The above-described microprocessor 3200 can achieve not only an increase in processing speed but also a reduction in power consumption because an integrated circuit is formed using a single crystalline semiconductor layer with uniform crystal orientation which is bonded to a support substrate having an insulating surface. In addition, since the oxide film containing halogen is formed on a back channel side (on the side opposite to a gate electrode) of the single crystalline semiconductor layer used for a transistor, the local level density is decreased and thus variation of a threshold voltages between transistors can be suppressed. Further, in addition to the oxide film containing halogen, a barrier layer is also formed between the support substrate and the single crystalline semiconductor layer, thereby preventing the single crystalline semiconductor layer from being contaminated by diffusion of an impurity such as metal of sodium or the like from the support substrate side. The relaxation layer can ease distortion due to stress applied to the single crystalline semiconductor layer, and generation of defects in stacking wirings can be suppressed.

Figure 11:
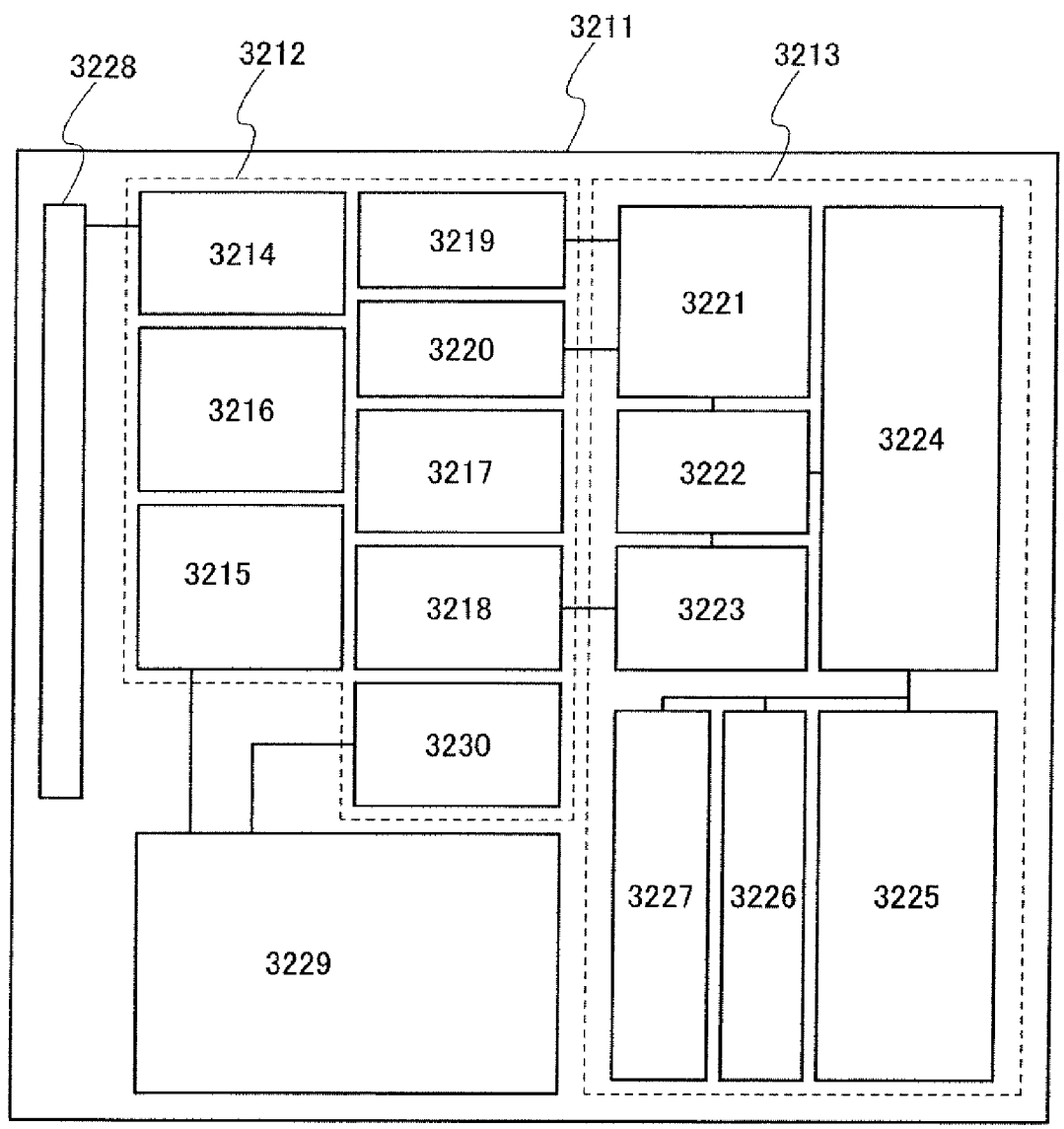
FIG. 11 is a block diagram describing a structure of an RFCPU that is obtained by a semiconductor device of the present invention.

Next, an example of a semiconductor device having an arithmetic function that enables contactless data transmission and reception is described with reference to FIG. 11. FIG. 11 illustrates an example of a computer that operates to transmit and receive signals to and from an external device by wireless communication (such a computer is hereinafter referred to as an RFCPU). An RFCPU 3211 has an analog circuit portion 3212 and a digital circuit portion 3213. The analog circuit portion 3212 has a resonance circuit 3214 with a resonance capacitor, a rectifier circuit 3215, a constant voltage circuit 3216, a reset circuit 3217, an oscillator circuit 3218, a demodulator circuit 3219, a modulator circuit 3220, and a power management circuit 3230. The digital circuit portion 3213 has an RF interface 3221, a control register 3222, a clock controller 3223, a CPU interface 3224, a central processing unit (CPU) 3225, a random-access memory (RAM) 3226, and a read-only memory (ROM) 3227.

The operation of the RFCPU 3211 having such a configuration is roughly as follows. The resonance circuit 3214 generates an induced electromotive force based on a signal received by an antenna 3228. The induced electromotive force is stored in a capacitor portion 3229 through the rectifier circuit 3215. This capacitor portion 3229 is preferably formed using a capacitor such as a ceramic capacitor or an electric double layer capacitor. The capacitor portion 3229 does not need to be integrated with the RFCPU 3211 and it is also possible that the capacitor portion 3229 may be mounted as a different component on a substrate having an insulating surface which constitutes a part of the RFCPU 3211.

The reset circuit 3217 generates a signal for resetting and initializing the digital circuit portion 3213. For example, the reset circuit 3217 generates a signal which rises after rise in the power supply voltage with delay as a reset signal. The oscillator circuit 3218 changes the frequency and duty ratio of a clock signal in response to a control signal generated by the constant voltage circuit 3216. The demodulator circuit 3219 formed using a low-pass filter binarizes the amplitude variability of, for example, a received amplitude-modulated (ASK) signal. The modulator circuit 3220 varies the amplitude of an amplitude-modulated (ASK) transmission signal and transmits the signal. The modulator circuit 3220 changes the amplitude of a communication signal by changing a resonance point of the resonance circuit 3214. The clock controller 3223 generates a control signal for changing the frequency and duty ratio of a clock signal in accordance with the power supply voltage or a consumption current of the central processing unit (CPU) 3225. The power supply voltage is managed by the power management circuit 3230.

A signal input from the antenna 3228 to the RFCPU 3211 is demodulated by the demodulator circuit 3219 and then decomposed into a control command, data, and the like by the RF interface 3221. The control command is stored in the control register 3222. The control command includes reading of data stored in the read-only memory (ROM) 3227, writing of data to the random-access memory (RAM) 3226, an arithmetic instruction to the central processing unit (CPU) 3225, and the like. The central processing unit (CPU) 3225 accesses the read-only memory (ROM) 3227, the random-access memory (RAM) 3226, and the control register 3222 via the CPU interface 3224. The CPU interface 3224 has a function of generating an access signal for any of the read-only memory (ROM) 3227, the random-access memory (RAM) 3226, and the control register 3222 based on an address the central processing unit (CPU) 3225 requests.

As an arithmetic method of the central processing unit (CPU) 3225, a method may be employed in which the read-only memory (ROM) 3227 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of processing is conducted by a dedicated arithmetic circuit and the other part of the arithmetic processing is conducted by the central processing unit (CPU) 3225 using a program.

The above-described RFCPU 3211 can achieve not only an increase in processing speed but also a reduction in power consumption because an integrated circuit is formed using a single crystalline semiconductor layer with uniform crystal orientation which is bonded to a substrate having an insulating surface or an insulating substrate. This makes it possible to ensure the operation for a long period of time even when the capacitor portion 3229 which supplies power is downsized. FIG. 11 illustrates the mode of the RFCPU, but for example, a device having a communication function, an arithmetic function and, a memory function, such as an IC tag may be employed.

Figure 12A:
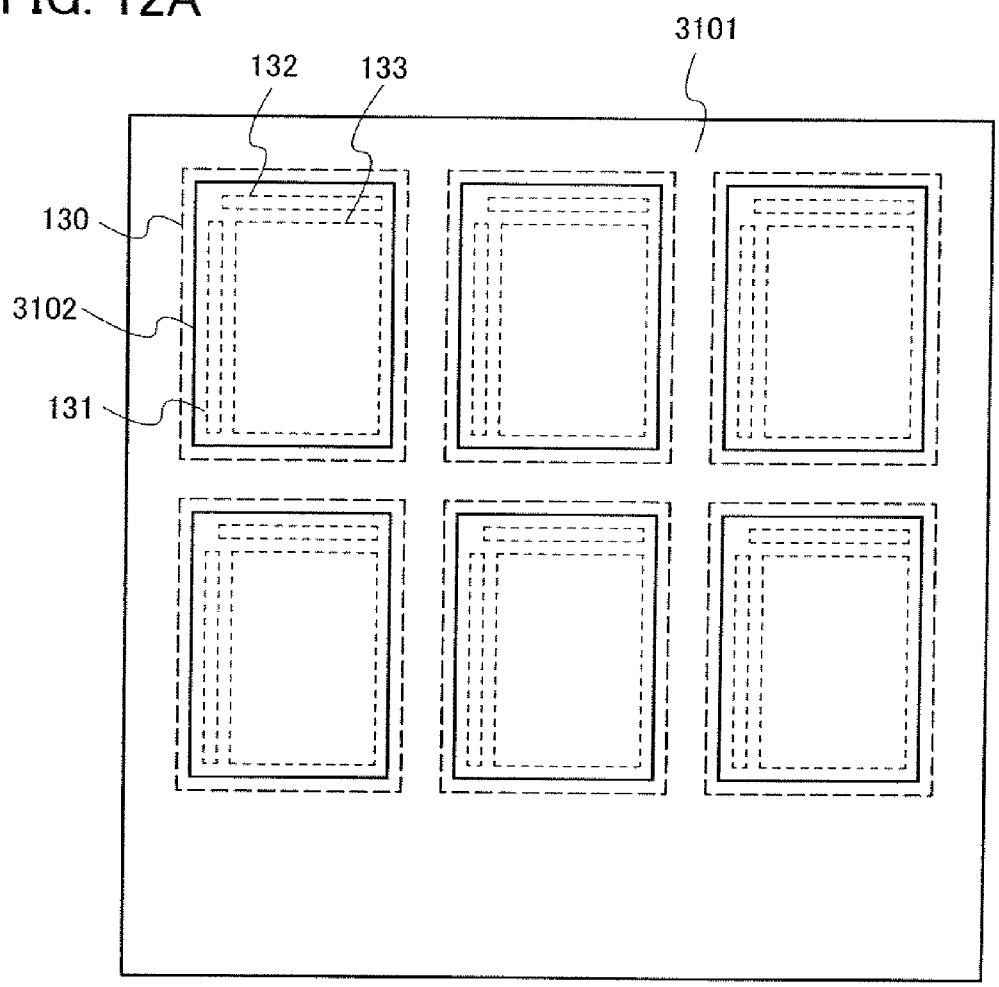
FIG. 12A is a plain view illustrating a case in which a single crystalline semiconductor layer is bonded to a mother glass for manufacturing a display panel.
Figure 12B:
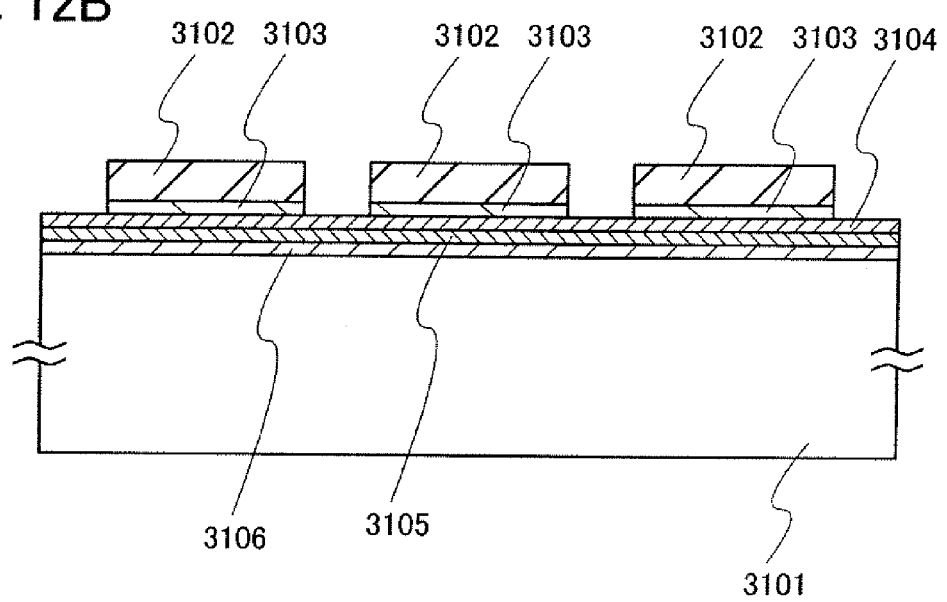
FIG. 12B is a cross-sectional view thereof.

Further, the single crystalline semiconductor layer according to this embodiment mode can be bonded to a large-sized glass substrate called mother glass used to manufacture a display panel. FIG. 12A illustrates a mode in which a single crystalline semiconductor layer 3102 is bonded to a mother glass, as a support substrate 3101 of the single crystalline semiconductor layer 3102. A plurality of display panels are taken out from the mother glass, and the single crystalline semiconductor layers 3102 are preferably bonded to match formation regions of display panels 3130. Since a mother glass substrate has a larger area than a semiconductor substrate, it is preferable that a plurality of single crystalline semiconductor layers 3102 be arranged within the formation regions of the display panels 3130, as shown in FIG. 12A. Accordingly, even if the plurality of single crystalline semiconductor layers 3102 are arranged over the mother glass serving as the support substrate 3101, a sufficient space can be provided between adjacent single crystalline semiconductor layers 3102. Each of the display panels 3130 includes a scan line driver circuit region 3131, a signal line driver circuit region 3132, and a pixel formation region 3133. The single crystalline semiconductor layer 3102 is bonded to the support substrate 3101 so as to include these regions. FIG. 12B is a cross-sectional view of FIG. 12A. When the plurality of single crystalline semiconductor layers 3102 are bonded to a large-sized glass substrate called mother glass, there is a concern that an impurity such as sodium is diffused from the mother glass serving as the support substrate 3101 and contaminates the single crystalline semiconductor layer 3102. In that case, the barrier film 3106 is preferably provided for the support substrate 3101 side. The barrier film 3106 is formed over the entire surface of the support substrate 3101, and diffusion of impurities can be prevented from the base film side of the single crystalline semiconductor layer 3102. Such a structure is suitable for manufacture of middle size display panels and small size display panels.

As shown in FIG. 8C, a MOS transistor is formed using the single crystalline semiconductor layer 3102, and the MOS transistor is connected to a display element, so that the display device shown in Embodiment Mode 1 can be manufactured.

As described above, a single crystalline semiconductor layer can be formed over mother glass, which is used to manufacture display devices, and a transistor can also be formed over mother glass. The transistor formed using a single-crystalline semiconductor layer is superior to an amorphous silicon transistor in all operation characteristics such as capacity of current drive; therefore, the transistor can be downsized. Accordingly, an aperture ratio of a pixel portion in a display panel can be increased. Further, since a microprocessor like the one illustrated in FIGS. 11 and 7A to 7D can be formed, a function as a computer can be provided in a display device. Moreover, a display which is capable of data input and output without contact can be manufactured.

Embodiment Mode 3

This embodiment mode will describe a method for forming a gate insulating film that can be applied to Embodiment Mode 1 or Embodiment Mode 2. As an example, a method for forming a silicon oxynitride film and a silicon nitride oxide film is given as a method for forming a gate insulating film.

First, the inside of the reaction chamber of the microwave plasma CVD apparatus is cleaned with fluorine radicals. The fluorine radicals are obtained by introducing carbon fluoride, nitrogen fluoride, or fluorine into a plasma generator provided outside the reaction chamber and dissociating the gas. By introducing the fluorine radicals into the reaction chamber, the reaction chamber can be cleaned. For the cleaning, radical cleaning is conducted by introducing fluorine radicals by remote plasma. The fluorine radical is obtained by nitrogen trifluoride ($NF_3$), for example. Plasma is generated by AC power of 50 kHz to 120 MHz (typically, 100 kHz to 500 kHz). Microwave may be discharged in the reaction chamber at the same time as radical cleaning by the remote plasma.

Next, as shown in FIG. 6A, an oxynitride silicon film is deposited as a protective film 201, on surfaces of the inner wall of the treatment container 180 of the reaction chamber, the dielectric plates 186, the gas pipes 197 and 198, the support 181, and the like. Here, a pressure in the treatment container 180 is from 10 to 100 Pa, preferably from 20 to 60 Pa, and at least one of rare gases of helium, argon, xenon, and krypton and an oxygen gas are introduced as plasma igniting gases to the treatment container 180. By introducing the oxygen gas with the rare gas into the treatment container 180, igniting plasma can be easily conducted. Next, a power supply of the microwave generation device 184 is turned on, and plasma 200 is generated in conditions such that an output of the microwave generation device 184 is from 500 to 6000 W, preferably, from 4000 to 6000 W. Then, a source gas is introduced from the gas pipe 198 into the treatment container 180. Specifically, supply of the oxygen gas is stopped, and dinitrogen monoxide, a rare gas, and silane are introduced as a source gas, whereby the silicon oxynitride film is formed as the protective film 201 on the surfaces of the inner wall of the treatment container 180, the gas pipes 197 and 198, the dielectric plates 186, and the support 181. Since dinitrogen monoxide is a gas that is not easily discharged, it is preferably blown out on the side opposite to the side where the microwave is introduced. At this time, a flow rate of silane is from 50 to 300 sccm, a flow rate of dinitrogen monoxide is from 300 to 3000 sccm, a flow rate of a rare gas such as argon is from 2000 to 3000 sccm, and a thickness of the protective film 201 is from 500 to 2000 nm.

Next, supply of the source gas is stopped, and the pressure in the treatment container 180 is reduced; thereafter, power supply of the microwave generation device 184 is turned off. Then, as shown in FIG. 6B, the substrate 1130 is introduced over the support 181 in the treatment container 180. Next, a silicon oxynitride film is deposited over the substrate by the similar step to that of the protective film. In other words, deposition is carried out under such conditions for forming the silicon oxynitride film that the substrate temperature is set to be from 250 to 400° C. (preferably, from 275 to 375° C.), and silane ($SiH_4$) is diluted with dinitrogen monoxide ($N_2O$) by 5 to 50 times, preferably, 20 to 30 times (the flow rate). Due to such conditions, generation of flakes (fine particles generated in the plasma CVD apparatus) can be suppressed.

After the silicon oxynitride film with a predetermined thickness is deposited, supply of a source gas is stopped, the pressure in the treatment container 180 is reduced, and the power supply of the microwave generation device 184 is turned off.

Next, the pressure in the treatment container 180 is set to be from 1 to 200 Pa, preferably from 1 to 100 Pa. At least one of rare gases of helium, argon, xenon, and krypton as a plasma ignition gas and source gases of silane, dinitrogen monoxide, and ammonia are introduced in the treatment container 180. Silane and dinitrogen monoxide are supplied from the gas pipe 198. Note that nitrogen may be introduced as a source gas instead of ammonia. Next, the power supply of the microwave generation device 184 is turned on, and the plasma 200 is generated in such conditions that the output of the microwave generation device 184 is from 500 to 6000 W, preferably from 4000 to 6000 W. The source gas is introduced into the treatment container 180 from the gas pipe 198, whereby a silicon nitride oxide film is formed over the silicon oxynitride film that is provided over the substrate 1130. After that, supply of the source gas is stopped, the pressure in the treatment container 180 is reduced, and the power supply of the microwave generation device 184 is turned off, so that the film formation process is completed.

Further, by mixing a rare gas such as argon for igniting plasma and keeping the plasma, separation of the source gas and formation of radicals can be efficiently performed by excited spices of the rare gas. In particular, helium is preferably used in generating plasma. Helium has an ionization energy of 24.5 eV which is the highest ionization energy in all gases, but helium has a metastable state in a level of about 20 eV which is a little lower than the level of the ionization energy. Thus, only about 4 eV that is a difference of level between the ionization energy and the metastable state is needed for ionization while keeping discharge. Therefore, a discharge starting voltage of helium shows the lowest value in all gases. In accordance with such characteristics, helium can hold discharge stably. Further, uniform plasma can be obtained.

In accordance with the above steps, the silicon oxynitride film as the protective film is formed on the inner wall of the reaction chamber, and the silicon oxynitride film and the silicon nitride oxide film are successively formed over the substrate, so that mixing an impurity such as silicon oxide into the silicon nitride film that is the upper layer of the gate insulating film can be reduced. Since the film has high withstand voltage, variation in threshold voltages of transistors can be reduced when the film is used as the gate insulating film. In addition, a BT characteristic can be increased. Further, withstand against static electricity is increased, so that a transistor that is hardly damaged even when a high voltage is applied thereto can be manufactured. Further, a transistor that is hardly damaged over time can be manufactured. Furthermore, a transistor that is hardly damaged due to hot carriers can be manufactured.

In a case where a single layer of a silicon oxynitride film is provided as the gate insulating film, the above-mentioned method for forming the protective film and the above-mentioned method for forming a silicon oxynitride film are used. In particular, when the flow rate of silane/dinitrogen monoxide is 1/5 to 1/50, preferably, 1/20 to 1/30, a silicon oxynitride film with high withstand voltage can be formed.

Embodiment Mode 4

Figure 21:
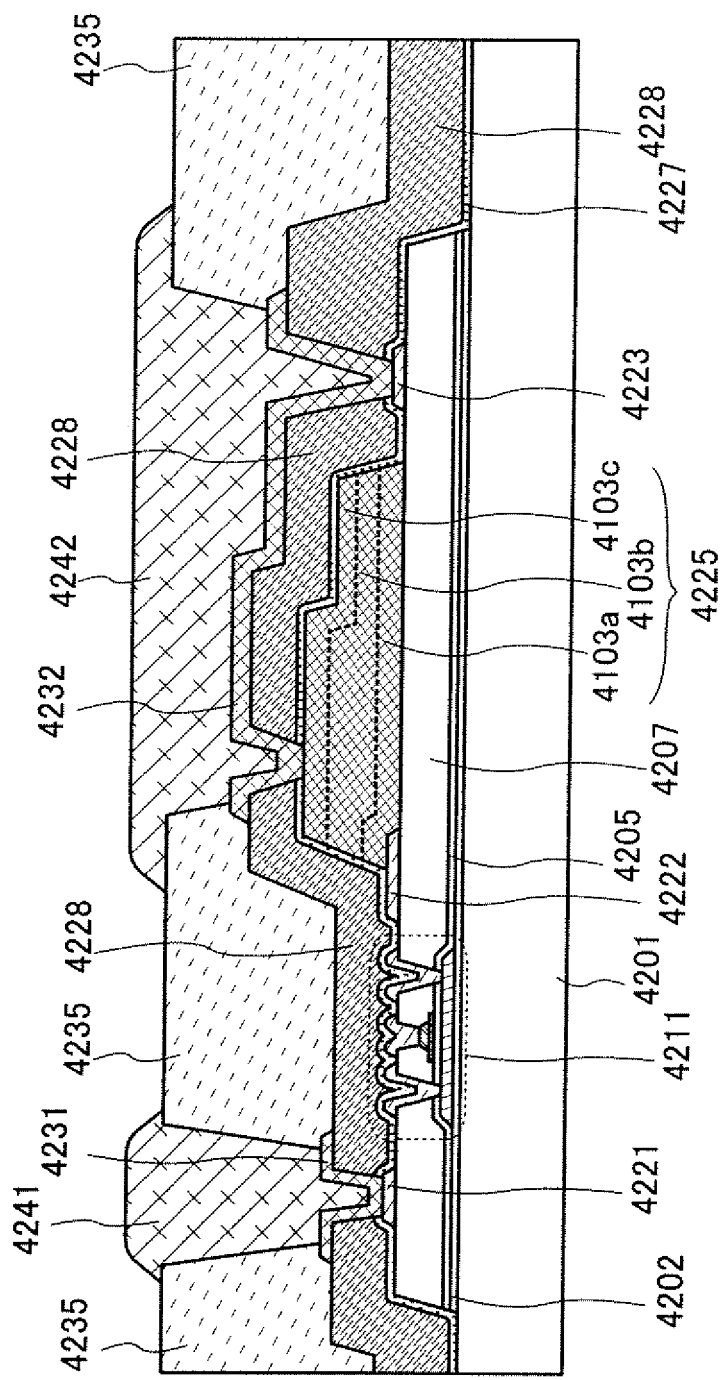
FIG. 21 is a cross-sectional view illustrating a structure of a semiconductor device of the present invention.

This embodiment mode will describe an optical sensor device as another example of a semiconductor device with reference to FIG. 21. This optical sensor device has a photoelectric conversion layer 4225 in a light receiving portion and is provided with a function by which an output of the photoelectric conversion layer 4225 is amplified by an amplifier circuit including a thin film transistor 4211 and then outputted. The photoelectric conversion layer 4225 and the thin film transistor 4211 are provided over a substrate 4201. As the substrate 4201, a substrate having a light-transmitting property, such as a glass substrate, a quartz substrate, or a ceramic substrate can be used.

An insulating film 4202 including one or more of silicon oxide, silicon nitride oxide, silicon nitride, and silicon oxynitride is provided over the substrate 4201 by a sputtering method or a plasma CVD method. The insulating film 4202 is provided for stress relaxation preventing and impurity contaminant. A crystalline semiconductor film 4203 constituting the thin film transistor 4211 is provided over the insulating film 4202. A gate insulating film 4205 and a gate electrode 4206 are provided over the crystalline semiconductor film 4203, which forms the thin film transistor 4211.

As a gate insulating film 4205, a silicon oxynitride film is used. Deposition is conducted under such conditions that the substrate temperature is set to be 250° C. to 400° C. (preferably, 275° C. to 375° C.), and silane ($SiH_4$) is diluted with dinitrogen monoxide ($N_2O$) by 5 to 50 times, preferably, 20 to 30 times (flow rate). Accordingly, a gate insulating film with high withstand voltage can be formed. Therefore, the manufacture yield and reliability of the optical sensor device can be improved.

An interlayer insulating film 4207 is provided over the thin film transistor 4211. The interlayer insulating film 4207 may be formed of a single insulating film or a stacked of insulating films of different materials. A wiring electrically connected to a source region and a drain region of the thin film transistor 4211 is formed over the interlayer insulating film 4207. In addition, over the interlayer insulating film 4207, an electrode 4221, an electrode 4222, and an electrode 4223, each of which is formed using the same material and the same steps with those of the wiring, are formed. The electrodes 4221 to 4223 are formed using a metal film, e.g., a low resistance metal film. Such a low resistance metal film can be an aluminum alloy, pure aluminum, or the like. Further, a three-layer structure as a stacked structure of such a low resistance metal film and a refractory metal film may be employed, in which a titanium film, an aluminum film, and a titanium film are sequentially stacked. In stead of a stacked structure of the refractory metal film and the low resistance film, the electrodes 221 to 223 can be formed of a single conductive film. Such a single conductive film may be formed of an element selected from titanium, tungsten, tantalum, molybdenum, neodymium, cobalt, zirconium, zinc, ruthenium, rhodium, palladium, osmium, iridium, or platinum; a single film using an alloy material or a compound material containing the aforementioned element as its main component; or a single film using nitride of the aforementioned element, e.g., titanium nitride, tungsten nitride, tantalum nitride, or molybdenum nitride.

The interlayer insulating film 4207, the gate electrode film 4205, and the insulating film 4202 are subjected to etching processing so as to have end portions in a tapered shape. By processing the interlayer insulating film 4207, the gate insulating film 4205, and the insulating film 4202 to have end portions into a tapered shape, coverage with a protective film 4227 formed over these insulating layers becomes improved, and effect that moisture, impurities, and the like hardly intrudes can be obtained.

A p-type semiconductor layer 4103a, an i-type semiconductor layer 4103b, and an n-type semiconductor layer 4103c are formed over the interlayer insulating film 4207. Note that the p-type semiconductor layer 4103a is at least partly contacted with the electrode 4222. The p-type semiconductor layer 4103a, the i-type semiconductor layer 4103b, and the n-type semiconductor layer 4103c are similar to those described in FIGS. 10 to 14C. The protective film 4227 is formed of, for example, silicon nitride over the photoelectric conversion layer 4225. The protective film 4227 can prevent moisture and impurities such as organic substances from being mixed into the thin film transistor 4211 and the photoelectric conversion layer 4225. An interlayer insulating film 4228 formed using an organic resin material such as polyimide or acryl is provided over the protective film 4227. An electrode 4231 is provided over the interlayer insulating film 4228, which is electrically connected to the electrode 4221. An electrode 4232 is provided, which is electrically connected to an upper layer of the photoelectric conversion layer (the n-type semiconductor layer 4103c) and the electrode 4223 through a contact hole in the interlayer insulating film 4228 and the protective film 4227. As the electrodes 4231 and 4232, tungsten, titanium, tantalum, silver, or the like can be used.

An interlayer insulating film 4235 is provided over the interlayer insulating film 4228 by a screen method or an ink-jet method, using an organic resin material such as an epoxy resin, polyimide, acryl, or a phenol resin. The interlayer insulating film 4235 is provided with openings over the electrode 4231 and the electrode 4232. Over the interlayer insulating film 4235, an electrode 4241 that is electrically connected to the electrode 4231 and an electrode 4242 that is electrically connected to the electrode 4232 are provided by a printing method, for example, using a nickel paste.

In FIG. 21, the optical sensor device is shown in which the photoelectric conversion layer 4225 is provided in the light receiving portion and an output of the photoelectric conversion layer 4225 is amplified by the amplifier circuit including the thin film transistor 4211 and then outputted. However, if the structure according to the amplifier circuit is omitted, the device can be used as an optical sensor.

Embodiment Mode 5

Display devices such as liquid crystal display devices and light-emitting devices, which are one mode of semiconductor devices obtained according to Embodiment Modes 1 to 3 can be used for a variety of modules (active matrix liquid crystal modules and active matrix EL modules). That is, the present invention can be implemented in all electronic devices in which these modules are incorporated into a display portion. Further, the present invention can be applied to all of electronic apparatuses in which an optical sensor device as one mode of a semiconductor device shown in Embodiment Mode 4 is incorporated.

As those kinds of electronic devices, cameras such as video cameras and digital cameras; displays that can be mounted on a person's head (goggle-type displays); car navigation systems; projectors; car stereos; personal computers; portable information terminals (such as mobile computers, cellular phones, and electronic book readers); and the like can be given. Examples of these devices are illustrated in FIGS. 13A to 13C.

Figure 13A:
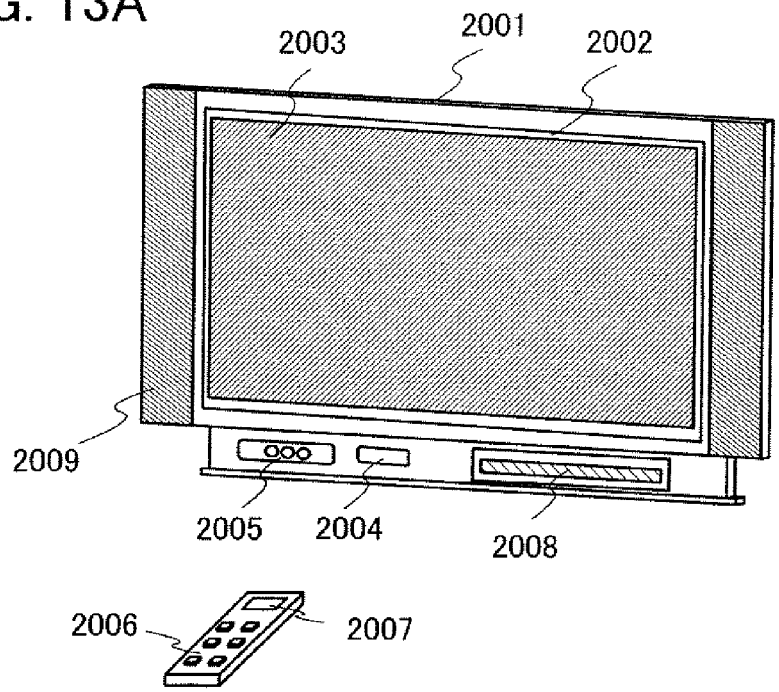
FIGS. 13A to 13C are perspective views each describing an electronic apparatus using a semiconductor device of the present invention.
Figure 13B:
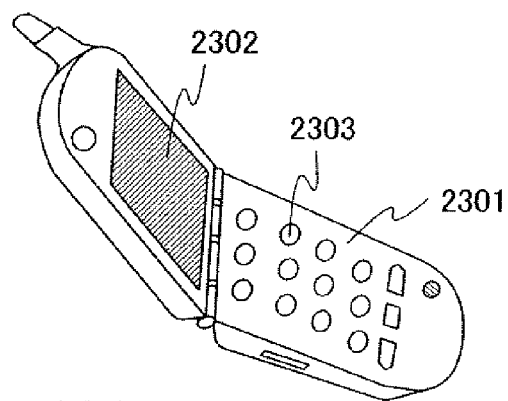
Figure 13C:
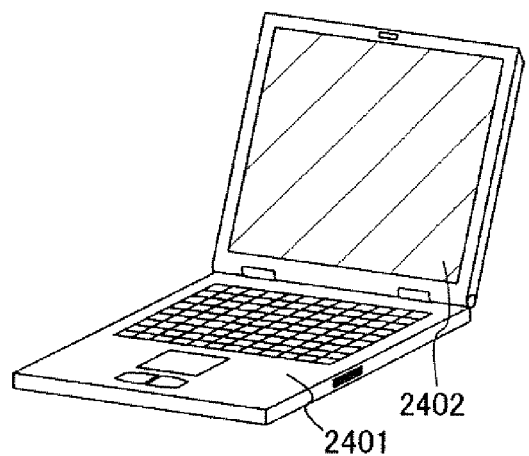

FIG. 13A illustrates a television device. A television device can be completed by incorporation of a display module into a chassis as illustrated in FIG. 13A. A display panel including components up to an FPC is also referred to as a display module. A main screen 2003 is formed with a display module, and speaker units 2009, operation switches, and the like are provided as accessory equipment. In this manner, a television device can be completed.

As illustrated in FIG. 13A, a display panel 2002 using display elements is incorporated into a chassis 2001, and in addition to reception of general television broadcast by a receiver 2005, communication of information in one direction (from a transmitter to a receiver) or in two directions (between a transmitter and a receiver or between receivers) can be performed by connection to a wired or wireless communication network via a modem 2004. Operations of the television device can be carried out using switches that are incorporated into the chassis or by a remote control device 2006 provided separately, and a display portion 2007 that displays information output to this remote control device may be provided for the remote control device.

Furthermore, in a television device, a sub-screen 2008 may be formed using a second display panel and used to display channel number, volume, and the like, in addition to the main screen 2003. In this structure, the main screen 2003 may be formed with a light-emitting display panel which has an excellent viewing angle, and the sub-screen 2008 may be formed with a liquid crystal display panel by which display at low power consumption is possible. In addition, in order to give priority to a shift toward lower power consumption, the structure may be set to be one in which the main screen 2003 is formed with a liquid crystal display panel, the sub-screen 2008 is formed with a light-emitting display panel, and the sub-screen is set to be turned on or off.

Needless to say, the present invention is not limited to being used in television devices and can be applied to a variety of applications such as monitors for personal computers and as display media that have a large area such as information display boards in railway stations, airports, and the like or street-side advertisement display boards.

FIG. 13B illustrates one mode of a cellular phone 2301. The cellular phone 2301 includes a display portion 2302, operation switches 2303, and the like. The display device described in the preceding embodiment modes is applied to the display portion 2302, so that yield can be improved.

In addition, a portable computer illustrated in FIG. 13C includes a main body 2401, a display portion 2402, and the like. The display device described in the preceding embodiment modes is applied to the display portion 2402, so that yield can be improved.

Embodiment 1

This embodiment will describe a result of a FT-IR measurement of a silicon nitride oxide film or a silicon nitride film which is formed over a substrate after a silicon oxide film or a silicon oxynitride film is formed as a protective film on an entire inner wall of a reaction chamber of a microwave plasma CVD apparatus, with reference to FIGS. 6A and 6B and FIGS. 20A to 20D.

Figure 20A:
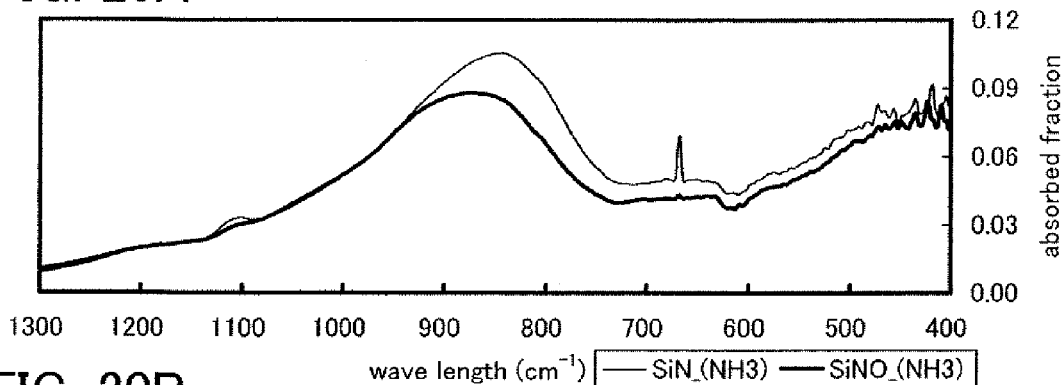
FIGS. 20A to 20D are graphs each describing a result of an FT-IR measurement of a silicon nitride oxide film and a silicon nitride film which are formed using the present invention.
Figure 20B:
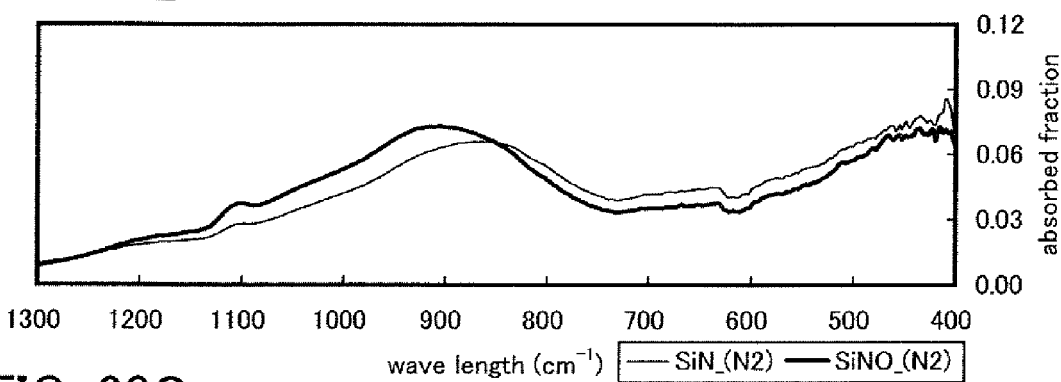

FIGS. 20A and 20B show measurement results by an FTIR (Fourier transform infrared spectroscopy) method in each case of forming a silicon nitride oxide film and forming a silicon nitride film in a reaction chamber where a silicon oxynitride film is formed as the protective film 201 of FIG. 6A. At this time, film-formation conditions of the protective film 201 were as follows: the substrate temperature was 325° C.; four microwave generation devices each of which has power of 5 kW were used; a pressure in the treatment container was 30 Pa; and the distance between the substrate 1130 and the dielectric plate 186 was 160 mm. Further, as source gases, silane with a flow rate of 250 sccm, dinitrogen monoxide with a flow rate of 2500 sccm, and argon with a flow rate of 500 sccm were made to flow from the gas pipe 198 having a nozzle on the substrate side, and argon with a flow rate of 1000 sccm was made to flow from the gas pipe 197 having a nozzle on the dielectric plate 186 side.

FIG. 20A shows part of waveforms by FT-IR of the silicon nitride film and the silicon nitride oxide film each formed over the substrate after the silicon oxynitride film is formed as the protective film 201 on the inner wall of the reaction chamber. At this time, film-formation conditions were as follows: a substrate temperature was 325° C.; four microwave generation devices each of which has power of 5 kW were used; a pressure in the treatment container was 30 Pa; and a distance between the substrate 1130 and the dielectric plate 186 was 160 mm. The flow rate of a reaction gas is shown in Table 1. In FIG. 20A, ammonia was used as a nitrogen supply gas. Note that, in Tables 1 to 4, Ar (upper side) represents a flow rate of Ar flowing from the gas pipe 197 having a nozzle on the dielectric plate 186 side, and Ar (lower side) represents a flow rate of Ar flowing from the gas pipe 198 having a nozzle on the substrate 1130 side.

| | flow rate of source gas(sscm) | | | | | |
|---|---|---|---|---|---|---|
| film | $SiH_4$ | $NH_3$ | $N_2$ | $N_2O$ | Ar (upper side) | Ar (lower side) |
| silicon nitride | 100 | 300 | 0 | 0 | 1000 | 500 |
| silicon nitride oxide | 100 | 300 | 0 | 30 | 1000 | 500 |

FIG. 20B shows part of waveforms by FT-IR of the silicon nitride film and the silicon nitride oxide film each formed over the substrate after the silicon oxynitride film is formed as the protective film 201 on the inner wall of the reaction chamber. At this time, film-formation conditions were as follows: the substrate temperature was 325° C.; four microwave generation devices each of which has power of 5 kW were used; the pressure in the treatment container was 30 Pa; and the distance between the substrate 1130 and the dielectric plate 186 was 160 mm. The flow rate of a reaction gas is shown in Table 2. In FIG. 20B, nitrogen was used as a nitrogen supply gas.

| | flow rate of source gas(sscm) | | | | | |
|---|---|---|---|---|---|---|
| film | $SiH_4$ | $NH_3$ | $N_2$ | $N_2O$ | Ar (upper side) | Ar (lower side) |
| silicon nitride | 100 | 0 | 300 | 0 | 1000 | 500 |
| silicon nitride oxide | 100 | 0 | 300 | 30 | 1000 | 500 |

Figure 20C:
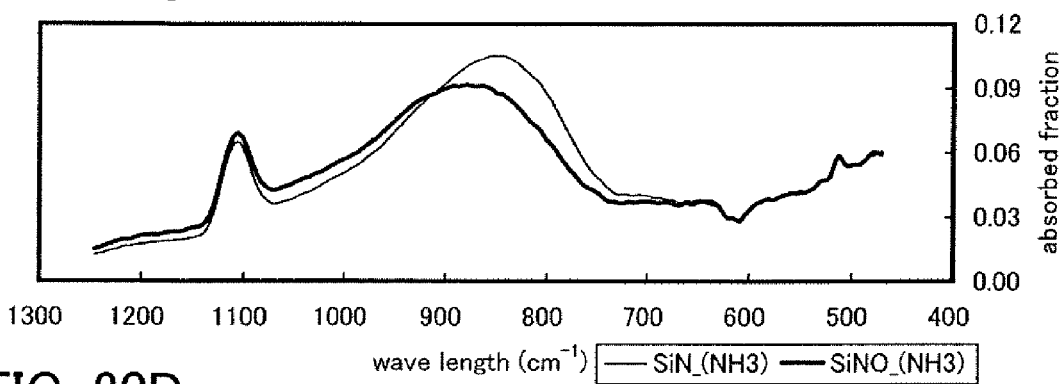
Figure 20D:
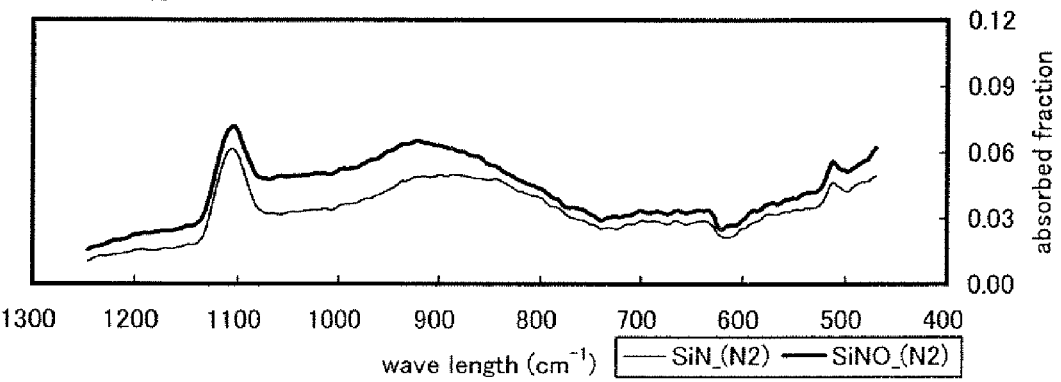

FIGS. 20C and 20D show measurement results by an FTIR method in each case of forming a silicon nitride oxide film and forming a silicon nitride film in a reaction chamber where a silicon oxide film is formed as the protective film 201 on an inner wall. At this time, film-formation conditions of the protective film 201 were as follows: the substrate temperature was 325° C.; four microwave generation devices each of which has power of 5 kW were used; the pressure in the treatment container was 30 Pa; and the distance between the substrate 1130 and the dielectric plate 186 was 160 mm. Further, as source gases, silane with a flow rate of 250 sccm, and oxygen with a flow rate of 1500 sccm were made to flow from the gas pipe 198 having a nozzle on the substrate 1130 side, and argon with a flow rate of 3500 sccm was made to flow from the gas pipe 197 having a nozzle on the dielectric plate 186 side.

FIG. 20C shows part of waveforms by FT-IR of the silicon nitride film and the silicon nitride oxide film each formed over the substrate after the silicon oxide film is formed as the protective film 201 on the inner wall of the reaction chamber. At this time, film-formation conditions were as follows: the substrate temperature was 325° C.; four microwave generation devices each of which has power of 5 kW were used; the pressure in the treatment container was 30 Pa; and the distance between the substrate 1130 and the dielectric plate 186 was 160 mm. The flow rate of the reaction gas is shown in Table 3. In FIG. 20C, ammonia was used as the nitrogen supply gas.

| film | flow rate of source gas(sscm) | | | | | |
|---|---|---|---|---|---|---|
| | $SiH_4$ | $NH_3$ | $N_2$ | $N_2O$ | Ar (upper side) | Ar (lower side) |
| silicon nitride | 100 | 300 | 0 | 0 | 1000 | 500 |
| silicon nitride oxide | 100 | 300 | 0 | 30 | 1000 | 500 |

FIG. 20D shows part of waveforms by FT-IR of the silicon nitride film and the silicon nitride oxide film each formed over the substrate after the silicon oxide film is formed as the protective film 201 on the inner wall of the reaction chamber. At this time, film-formation conditions were as follows: the substrate temperature was 325° C.; four microwave generation devices each of which has power of 5 kW were used; a pressure in the treatment container was 30 Pa; and a distance between the substrate 1130 and the dielectric plate 186 was 160 mm. The flow rate of the reaction gas is shown in Table 4. In FIG. 20D, nitrogen was used as the nitrogen supply gas.

| film | flow rate of source gas(sscm) | | | | | |
|---|---|---|---|---|---|---|
| | $SiH_4$ | $NH_3$ | $N_2$ | $N_2O$ | Ar (upper side) | Ar (lower side) |
| silicon nitride | 100 | 0 | 300 | 0 | 1000 | 500 |
| silicon nitride oxide | 100 | 0 | 300 | 30 | 1000 | 500 |

In FIGS. 20C and 20D, stretching vibration of Si—N bonds is observed in the vicinity of 870 cm$^{-1}$, and stretching vibration of Si—O bonds is observed in the vicinity of 1080 cm$^{-1}$. That is, it is found that silicon oxide is contained in each of the formed silicon nitride film and the formed silicon nitride oxide film.

On the other hands, in FIGS. 20A and 20B, although stretching vibration of Si—N bonds is observed in the vicinity of 870 cm$^{-1}$, stretching vibration of Si—O bonds is hardly observed in the vicinity of 1080 cm$^{-1}$. That is, it is found that silicon oxide is not contained in each of the formed silicon nitride film and the formed silicon nitride oxide film.

Accordingly, it is found that a film that include few impurities can be formed by forming a silicon oxynitride film as the protective film 201 on an inner wall of a reaction chamber before a silicon nitride oxide film and a silicon nitride film are each formed.

Embodiment 2

Figure 14A:
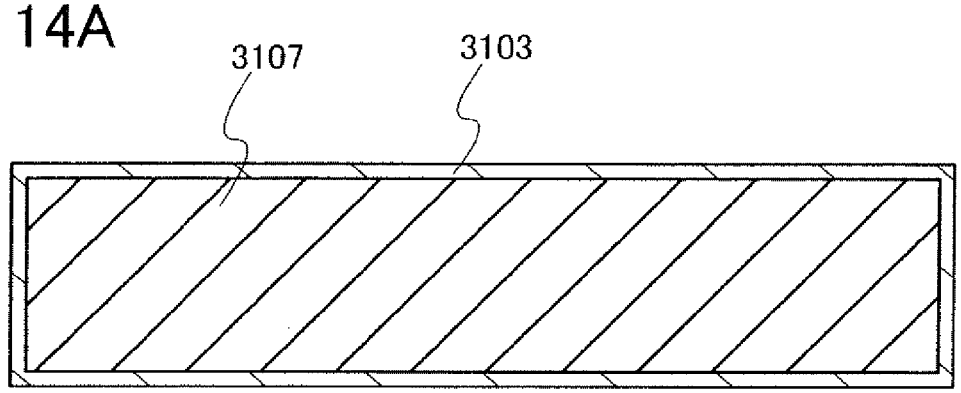
FIGS. 14A to 14C are cross-sectional views describing a method for manufacturing an SOI substrate of the present invention.

A method for manufacturing an SOI substrate shown in Embodiment Mode 2 will be described with reference to drawings. In FIG. 14A, a p-type or n-type single crystalline silicon substrate (silicon wafer), a germanium substrate, or a substrate of a compound semiconductor such as gallium arsenide or indium phosphide can be applied as a single crystalline semiconductor substrate 3107. After an oxide film on a surface of the single crystalline semiconductor substrate 3107 is removed, an insulating film 3103 containing halogen is formed on the surface of the single crystalline semiconductor substrate 3107. Degreasing cleaning or the like can be performed for removing the oxide film. Thermal treatment in which halogen is added to an oxide atmosphere is preferably performed for formation of the insulating film 3103 containing halogen. For example, thermal treatment is carried out in an atmosphere containing HCL at a ratio of 0.5 to 10 vol % (preferably, 3 vol %) with respect to oxygen at a temperature of 700° C. or higher. It is preferable to carry out the thermal treatment at a temperature of 950° C. to 1150° C. Time for processing thermal treatment is 0.1 to 6 hours, preferably, 0.5 to 1 hour. As halogen to be added, one or more kinds of HF, $NF_3$, HBr, $Cl_2$, $ClF_3$, $BCl_3$, $F_2$, and $Br_2$ can be applied as well as HCl. The insulating film 3103 containing halogen has a thickness of 10 to 1000 nm (preferably, 50 to 200 nm), for example, 100 nm. The insulating film 3103 containing halogen has halogen concentration of $1 \times 10^{17}$ to $5 \times 10^{20}$/cm$^3$, so that the insulating film 3103 prevent contamination of the single crystalline semiconductor substrate 3107 by capturing an impurity such as metal.

By forming the insulating film 3103 containing halogen at such a temperature range, a gettering effect by a halogen element can be obtained. Gettering has particularly an effect of removing metal impurities. That is, an impurity such as metal is converted into volatile halide such as chloride by action of halogen typified by chlorine to be released into air, thereby being removed. In particular, the gettering effect is effective in a case where the surface of the single crystalline semiconductor substrate 3107 is subjected to chemical mechanical polishing (CMP) treatment. Further, hydrogen has a function of compensating defects at an interface between the single crystalline semiconductor substrate 3107 and the insulating film 3103 containing halogen and reducing the localized level density at the interface.

Figure 14B:
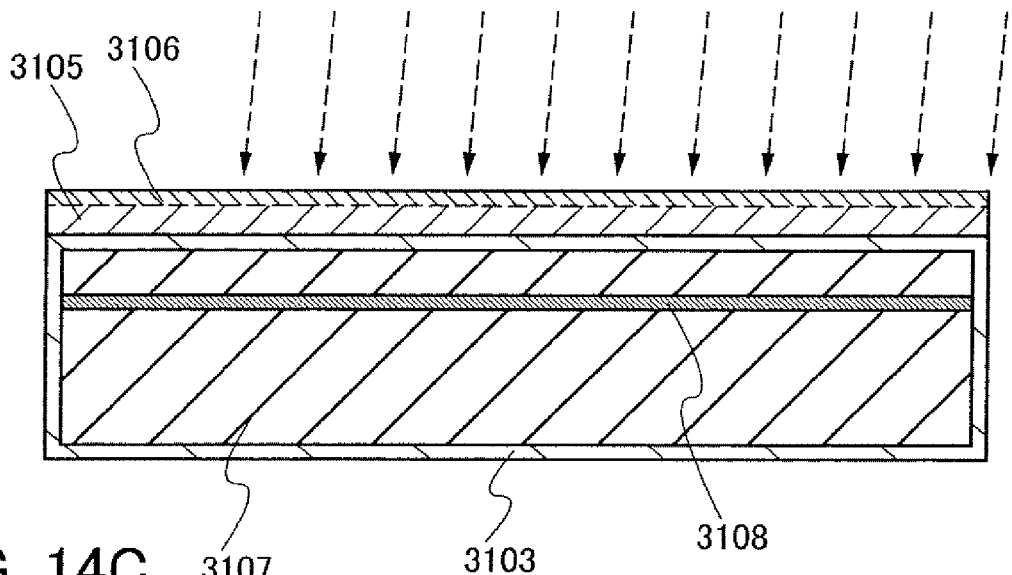

In FIG. 14B, a relaxation film 3105 is formed in contact with the insulating film 3103 containing halogen. The relaxation film 3105 is preferably formed of a silicon oxide film or a silicon oxynitride film by a plasma CVD method to have a thickness of 10 to 5000 nm, preferably 30 to 1000 nm. In a case where a silicon oxynitride film is formed, hydride of silicon or a fluoride gas and a nitrogen oxide gas (typically, $SiH_4$ and $N_2O$) may be used as a source gas, and a deposition temperature may be 500° C. or lower, so that nitrogen is contained at the concentration of less than 20 atomic % (preferably, 0.01 to 10 atomic %) and hydrogen (and/or OH group) is contained at 1 to 20 atomic % is contained.

After the relaxation film 3105 is formed, a barrier film 3106 is formed. The relaxation film 3105 and the barrier film 3106 are preferably formed successively. The barrier film 3106 is formed of a silicon nitride film or a silicon nitride oxide film by a vapor deposition method to have a thickness of 50 to 200 nm. For example, the silicon nitride film is formed by a plasma CVD method using $SiH_4$ and $NH_3$ as a source gas. The silicon nitride oxide film is formed by a plasma CVD method using $SiH_4$, $N_2O$, and $NH_3$ as a source gas. The barrier film 3106 has an effect of preventing diffusion of an impurity. In addition, the barrier film 3106 can prevent the surface of the single crystalline semiconductor substrate 3107 from being damaged by irradiation with ions and from losing planarity of the surface when a separation layer 3108 is formed.

After the barrier film 3106 and the relaxation film 3105 are formed, hydrogen or halogen ions are implanted to form the separation layer 3108. The separation layer 3108 is formed by implanting ions accelerated in an electric filed at a predetermined depth. The depth at which the separation layer 3108 is formed in the single crystalline semiconductor substrate 3107 is 5 to 500 nm, preferably, 10 to 100 nm as a guide. The depth at which the separation layer 3108 is formed in the single crystalline semiconductor substrate 3107 can be controlled by an accelerating energy of ions, an incident angle of the ions, and the thicknesses of the barrier film 3106 and the relaxation film 3105. In this case, the relaxation film 3105 contains silicon oxide or silicon oxynitride as its main component, and the internal stress thereof can be small; therefore, the relaxation film can be formed relatively thick. In other words, the ion implantation depth at which the separation layer 3108 is formed can be controlled by a thickness of the relaxation film 3105.

The separation layer 3108 is formed in a region at a predetermined depth (a depth proximate to the mean intrusion depth of ions) from the surface of the single crystalline semiconductor substrate 3107. For example, a thickness of a single crystalline semiconductor layer is 5 to 500 nm, preferably, 10 to 200 nm. The accelerating voltage in implanting ions is determined by considering the thicknesses of the barrier film 3106 and the relaxation film 3105. Ion implantation is preferably conducted by using an ion doping device. That is, a doping method is used in which a plurality of ion spices produced by exciting a source gas into plasma are implanted without being separated by mass. In this case, it is preferable to implant ions of one kind or ions of a plurality of kinds which consist of the same atom and has different masses. Ion doping may be conducted in such conditions that the accelerating voltage is 10 to 100 kV, preferably, 30 to 80 kV; the does is $1\times10^{16}$ to $4\times10^{16}/cm^2$; and the beam current density is 2 $\mu A/cm^2$ or more, preferably, 5 $\mu A/cm^2$ or more, more preferably, 10 $\mu A/cm^2$. Defects generated in the semiconductor layer by implantation can be reduced.

In the case of implanting hydrogen ions, the hydrogen ions preferably include $H^+$, $H_2^+$, and $H_3^+$ ions with a high proportion of $H_3^+$ ions. With a high proportion of $H_3^+$ ions, the implantation efficiency can be increased and implantation time can be shortened. Accordingly, it is possible to contain hydrogen of $1\times10^{20}/cm^3$ (preferably, $5\times10^{20}/cm^3$) or more in a region where the separation layer 3108 is formed in the single crystalline semiconductor substrate 3107. When a hydrogen ion-implantation region with high concentration is locally formed in the single crystalline semiconductor substrate 3107, a crystalline structure is disturbed, and microvoids are formed, whereby the separation layer 3108 has a porous structure. In this case, volumes of microvoids formed in the separation layer 3108 are changed by thermal treatment at a relative low temperature, and cleavage is performed along the separation layer, whereby a thin single crystalline semiconductor layer can be obtained by separation.

If mass separation of ions are conducted and the ions are implanted into the single crystalline semiconductor substrate 3107, the separation layer 3108 can be formed similarly. In this case, it is preferable to selectively implant ions with large mass numbers (for example, $H_3^+$ ions), which leads to the similar effect to the aforementioned effect.

An inert gas such as deuterium or helium can be selected as a gas generating ion species for producing ions as well as hydrogen. By using helium as a source gas and using an ion doping apparatus without having function of mass separation, an ion beam with a high proportion of $H_3^+$ ions can be obtained. Such ions are implanted into the single crystalline semiconductor substrate 3107, whereby microvoids can be formed, and the separation layer 3108 similar to the aforementioned can be provided in the single crystalline semiconductor substrate 3107.

Figure 14C:
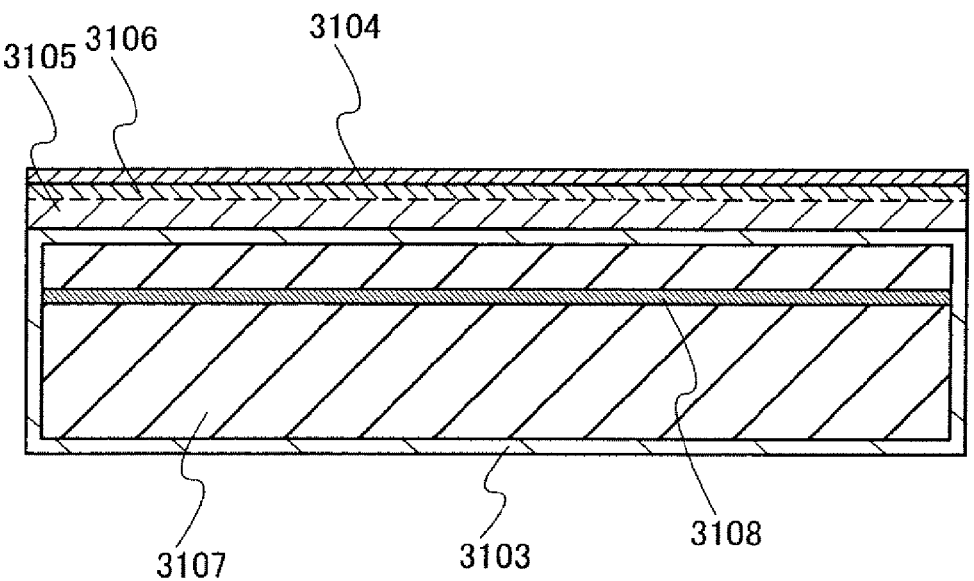

As shown in FIG. 14C, a bonding layer 3104 is formed. As the bonding layer 3104, a silicon oxide film is preferably formed. The thickness of the silicon oxide film may be from 10 to 200 nm, preferably, from 10 to 100 nm, more preferably, from 20 to 50 nm. The silicon oxide film is preferably formed using an organic silane gas by a chemical vapor deposition method. As an organic silane gas, a compound containing silicon can be used, such as tetraethyl orthosilicate (TEOS: chemical formula, $Si(OC_2H_5)_4$), tetramethylsilane (TMS: chemical formula, $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethylaminosilane ($SiH(N(CH_3)_2)_3$). In addition, a silicon oxide film formed by a chemical vapor deposition method using a silane gas can be applied.

In film formation by a chemical vapor deposition method, as a temperature at which degassing does not occur from the separation layer 3108 formed in the single crystalline semiconductor substrate, a deposition temperature of 350° C. or lower, for example, is applied. Further, a thermal treatment temperature that is higher than the deposition temperature of the bonding layer 3104 is applied to thermal treatment by which the single crystalline semiconductor layer is separated from the single crystalline semiconductor substrate.

In the steps shown in FIGS. 14B and 14C, the relaxation film 3105, the barrier film 3106, and the bonding layer 3104 may be formed successively after the separation layer 3108 is formed. In accordance with this step, the relaxation film 3105, the barrier film 3106, and the bonding layer 3104 can be formed without being exposed to atmospheric air. In addition, mixing a foreign substance or contamination by potassium or sodium can be prevented.

Figure 15A:
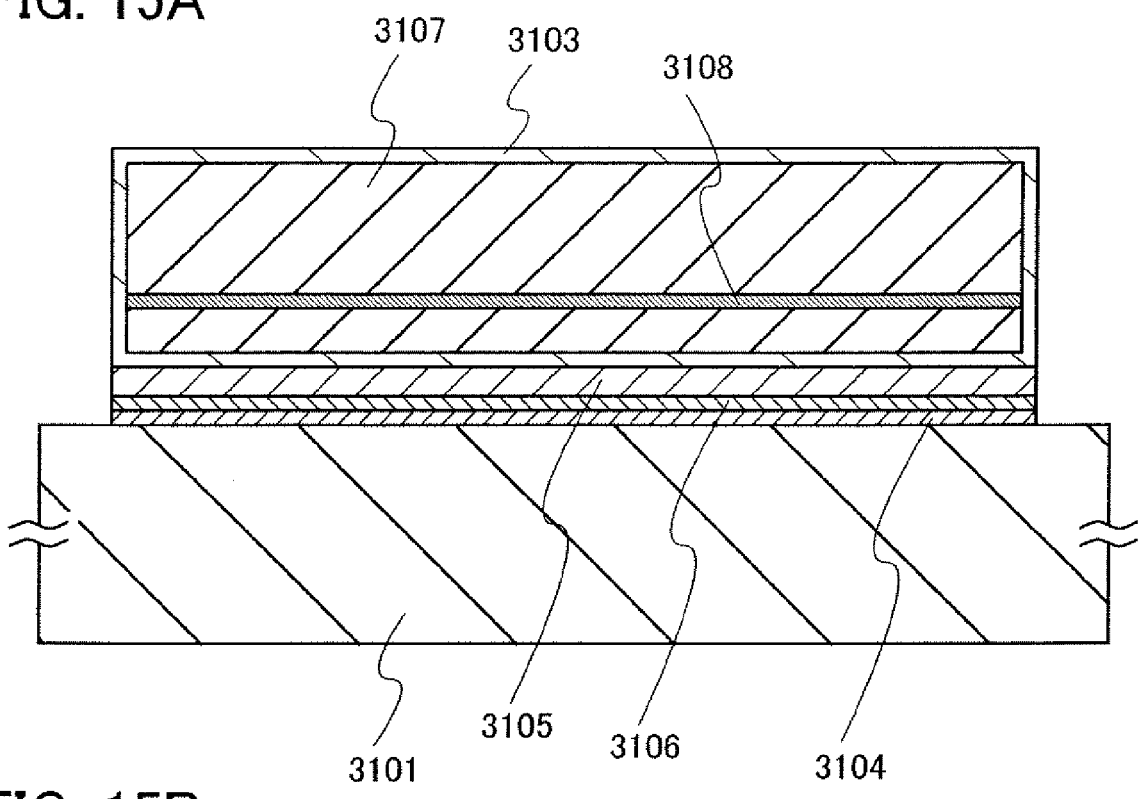
FIGS. 15A and 15B are cross-sectional views describing a method for manufacturing an SOI substrate of the present invention.

FIG. 15A shows a mode of bonding a support substrate 3101 and the single crystalline semiconductor substrate 3107. The support substrate 3101 and the surface of the single crystalline semiconductor substrate 3107 where the bonding layer 3104 is formed are disposed to face each other, and are brought into close contact with each other to be bonded. The surfaces of the support substrate and the bonding layer, which are brought into close contact with each other, may be cleaned sufficiently. By bringing the support substrate 3101 and the bonding layer 3104 into close contact with each other, the support substrate and the bonding layer can be bonded. When the support substrate 3101 and the single crystalline semiconductor substrate 3107 are contacted with each other and pressed, a firm bonding can be obtained by hydrogen bond, and it is considered that Van der Waals forces are acted in the initial step.

In order to form favorable bonding, the surfaces of the bonding layer 3104 and the support substrate 3101 may be activated. For example, the surfaces at which the bonding layer 3104 and the support substrate 3101 are to be bonded with each other is subjected to surface treatment. For example, the surfaces are irradiated with an atom beam or ion beam as the surface treatment. When an atom beam or an ion beam is utilized, an neutral atomic beam of an inert gas such as argon or an ion beam of an inert gas can be used. In addition, irradiation with plasma or radical treatment is performed. By such surface treatment, it becomes possible to increase bonding strength between different kinds of materials even at a temperature of 200° C. to 400° C.

As the support substrate 3010, the support substrate 3101 described in Embodiment Mode 2 can be used similarly, and a glass substrate used in the electronics industry (also called "non-alkali glass substrate"), such as an aluminosilicate glass substrate, an aluminoborosilicate glass substrate, or a barium borosilicate glass substrate is typically applied. In other words, a glass substrate having a coefficient of thermal expansion of from $25 \times 10^{-7}$ to $50 \times 10^{-7}/°$ C. (preferably, from $30 \times 10^{-7}$ to $40 \times 10^{-7}/°$ C.) and a strain point of from 580° C. to 680° C. (preferably, from 600° C. to 680° C.) can be applied. Alternatively, a quartz substrate, a ceramic substrate, a metal substrate having a surface coated with an insulating film, or the like can be used.

Figure 15B:
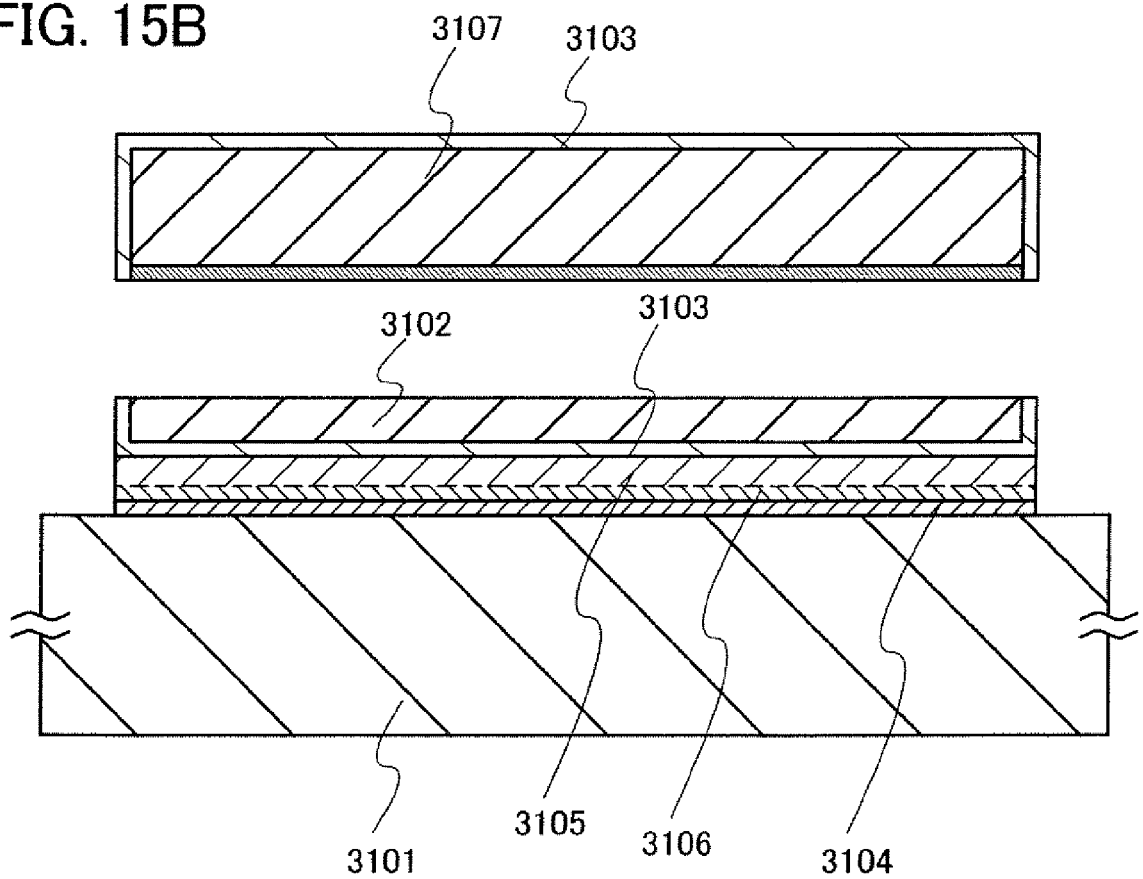

FIG. 15B shows a mode of separating a single crystalline semiconductor layer 3102 from the single crystalline semiconductor substrate 3107. Thermal treatment is conducted in a state where the single crystalline semiconductor substrate 3107 and the support substrate 3101 are superposed on each other. Separation of the single crystalline semiconductor substrate 3107 is performed by thermal treatment in such a way that the single crystalline semiconductor layer 3102 is left on the support substrate 3101. The thermal treatment is preferably performed at a temperature equal to or higher than the deposition temperature of the bonding layer 3104, which is 400° C. or higher and lower than 600° C. Performing the thermal treatment at a temperature within this range causes volume change of the microvoids formed in the separation layer 3108, and cleavage can be conducted along the separation layer 3108. Since the bonding layer 3104 is bonded to the support substrate 3101, the single crystalline semiconductor layer 3102 that has the same crystallinity as the single crystalline semiconductor substrate 3107 is bonded over the support substrate 3101.

Figure 16A:
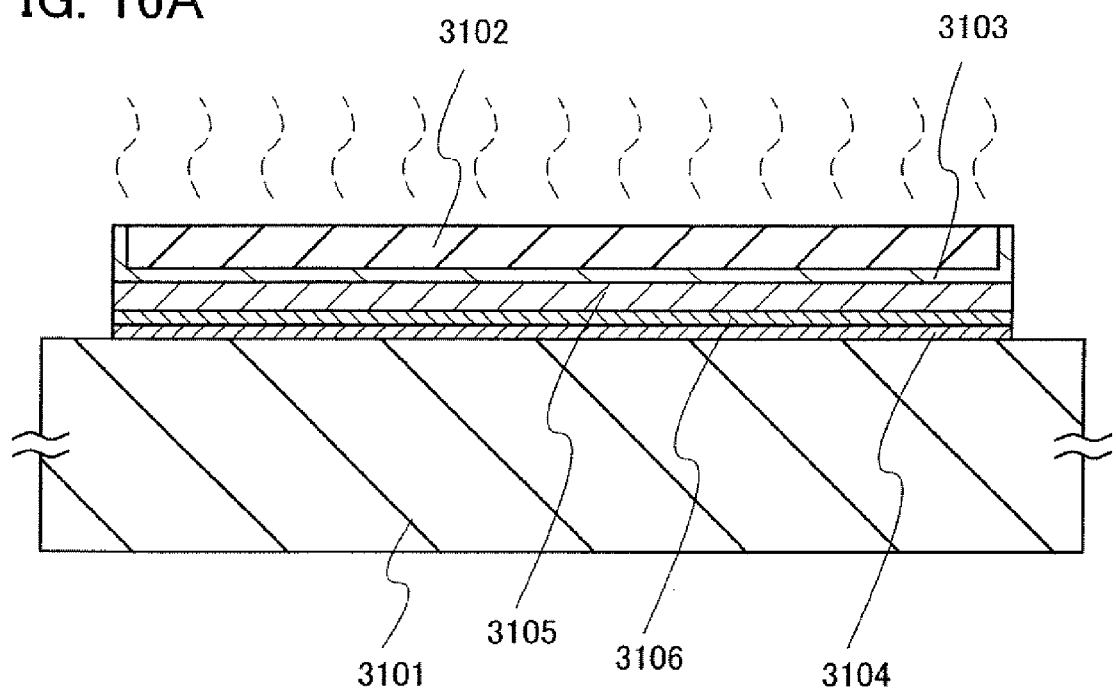
FIGS. 16A and 16B are cross-sectional views describing a method for manufacturing an SOI substrate of the present invention.

FIG. 16A shows a mode of performing thermal treatment in which the single crystalline semiconductor layer 3102 is bonded to the support substrate 3101. This thermal treatment can make hydrogen or halogen implanted for formation of the separation layer 3108 get out into air from the single crystalline semiconductor layer 3102. Further, this thermal treatment can be performed in order to remove the microvoids in the bonding portion between the support substrate 3101 and the single crystalline semiconductor layer 3102, that is, in the vicinity of the bonding layer 3104. An allowable temperature for the thermal treatment is higher than or equal to a temperature at which hydrogen or halogen gets out from the single crystalline semiconductor layer 3102 and lower than or equal to a temperature close to a strain point of the support substrate 3101. For example, the thermal treatment is performed within a temperature range from 400° C. to 730° C. For a thermal treatment apparatus, an electrically-heated oven, a lamp annealing furnace, or the like can be applied. The thermal treatment may be performed with multilevel changes of temperature. Furthermore, a rapid thermal annealing (RTA) apparatus may be used. In a case where thermal treatment is performed using an RTA apparatus, heating can be performed at a temperature that is close to the strain point of the support substrate or a temperature slightly higher than the strain point. Such thermal treatment can change the hydrogen bond between the support substrate 3101 and the single crystalline semiconductor layer 3102 into firmer covalent bond.

Excessive halogen contained in the single crystalline semiconductor layer 3102 shows complicated behaviors and may operate so as to degrade characteristics of a semiconductor element depending on thermal history. For example, hydrogen contained between lattices of silicon has an operation of inactivating an impurity element added for the purpose of valence electron control. Accordingly, threshold voltage of the transistor that is a semiconductor element is changed, and a resistance of source and drain regions is increased. Further, when hydrogen is contained between the lattices of silicon, the coordination number of silicon may be changed, and silicon may behave so as to generate lattice defects. As a matter of course, hydrogen or halogen has a function of compensating dangling bonds in silicon, in other words, a function of compensating defects, but it may degrade characteristics of the semiconductor element as described. Therefore, it is preferable that hydrogen or halogen that has been implanted to form the separation layer 3108 be removed from the single crystalline semiconductor layer 3102 once.

Figure 16B:
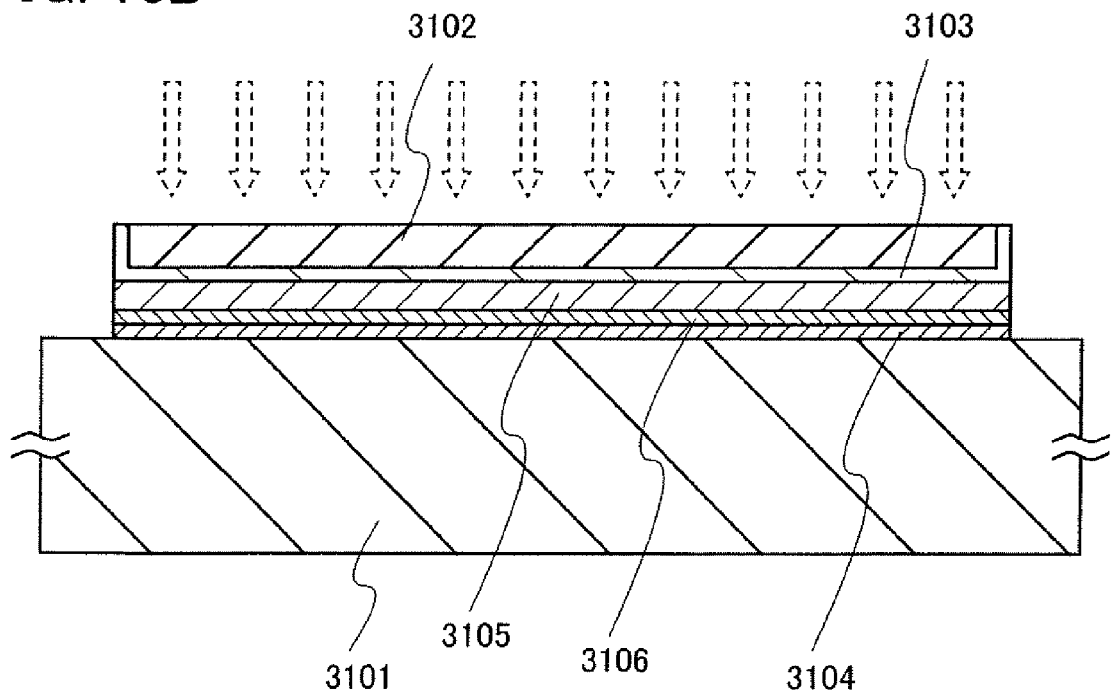

FIG. 16B shows a mode in which crystal defects are repaired by irradiation of the single crystalline semiconductor layer 3102 with an energy beam. When the single crystalline semiconductor layer 3102 is bonded to the support substrate 3101 and/or separated from the support substrate 3101, the single crystalline semiconductor layer 3102 is thermally and/or mechanically damaged so that the crystallinity of the single crystalline semiconductor layer 3102 is decreased. Thus, this mode is preferably conducted to repair the damage. It is preferable that the energy beam be selectively absorbed to the single crystalline semiconductor layer 3102, and a laser beam is preferably applied. This is because the defects of the single crystalline semiconductor layer 3102 can be repaired without heating excessively the support substrate 3101. As the laser beam, a gas laser typified by an excimer laser or a solid state laser typified by a YAG laser can be used as a light source. A wavelength of the laser beam is preferably in a range of from ultraviolet light to a visible light region, and a wavelength of 190 to 700 nm is applied. The laser beam emitted from the light source is preferably converged in a rectangular or linear shape by an optical system, and irradiation may be performed by scanning the single crystalline semiconductor layer 3102 with the laser beam. Besides, flash lamp annealing which is performed using a halogen lamp, a xenon lamp, or the like as an energy beam may be applied for a similar object.

In this process, dehydrogenation of the single crystalline semiconductor layer 3102 is conducted in FIG. 16A. Therefore, crystal defects can be repaired without generating pores in the singe crystalline semiconductor layer 3102. Further, in FIG. 16B, by performing treatment in which the single crystalline semiconductor layer 3102 is irradiated with an energy beam in a nitrogen atmosphere, the surface of the single crystalline semiconductor layer 3102 can be planarized.

Figure 17A:
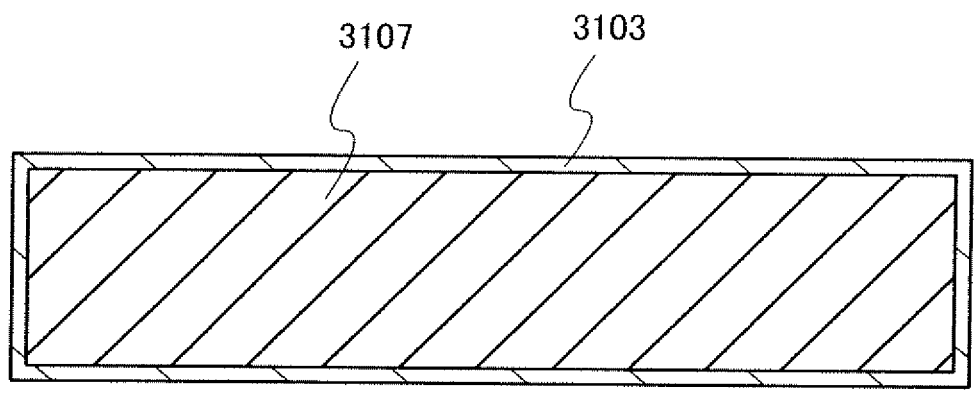
FIGS. 17A and 17B are cross-sectional views describing a method for manufacturing an SOI substrate of the present invention.
Figure 17B:
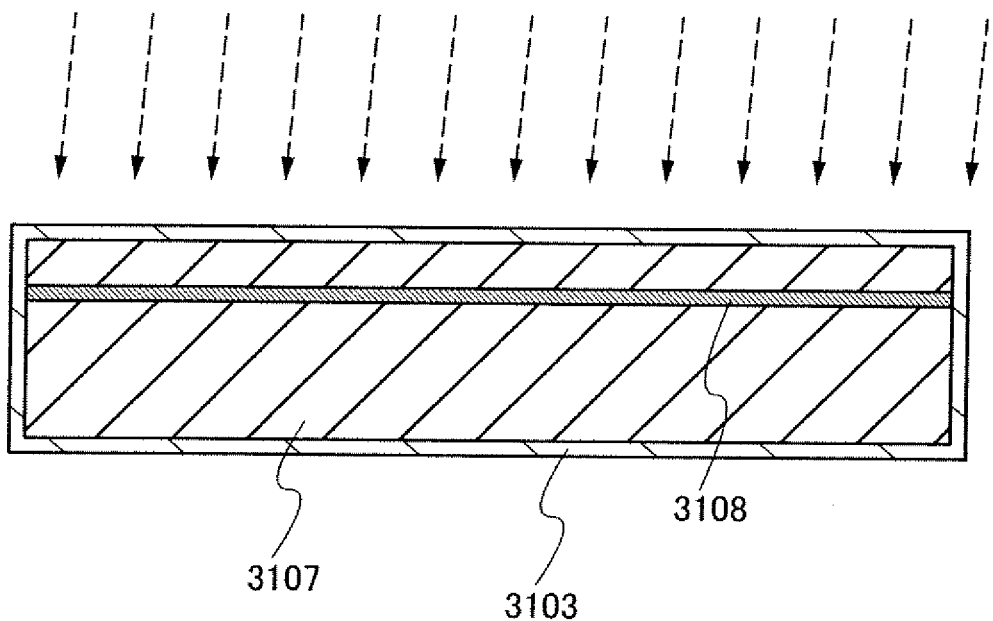

Next, another method for manufacturing a single crystalline semiconductor substrate will be described with reference to FIGS. 17A to 19B. In FIG. 17A, the insulating film 3103 containing halogen is provided for the single crystalline semiconductor substrate 3107. The insulating film 3103 containing halogen is preferably formed by performing thermal oxidation at a temperature of 700° C. or higher, preferably, from 950° C. to 1150° C. in an atmosphere containing HCl at 0.5 to 10 volume % (preferably 3 volume %) with respect to oxygen. Then, a separation layer 3108 is formed as shown in FIG. 17B.

Figure 18A:
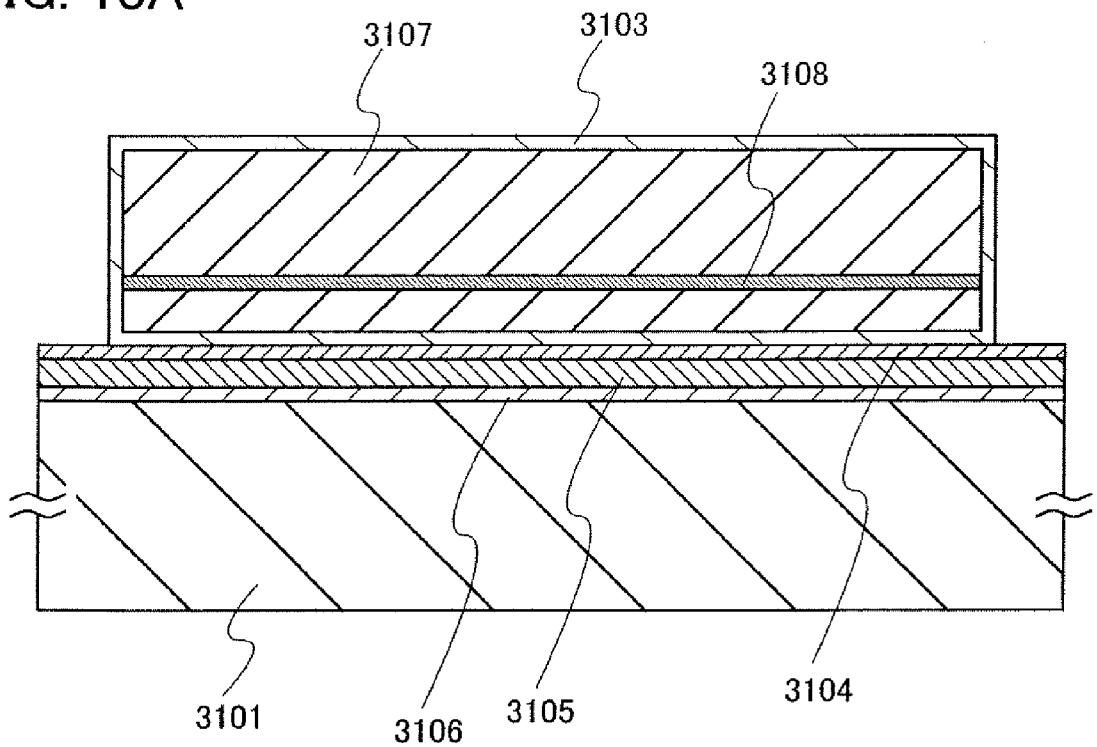
FIGS. 18A and 18B are cross-sectional views describing a method for manufacturing an SOI substrate of the present invention.

In FIG. 18A, the support substrate 3101 is provided with the barrier film 3106, the relaxation film 3105, and the bonding layer 3104. The barrier film 3106 is formed of a silicon nitride film or a silicon nitride oxide film by a vapor deposition method to have a thickness of 50 to 200 nm. For example, the silicon nitride film is formed by a plasma CVD method using $SiH_4$ and $NH_3$ as a source gas. The silicon nitride oxide film is formed by a plasma CVD method using $SiH_4$, $N_2O$, and $NH_3$. The barrier film 3106 has an effect of prevention of impurity diffusion. The relaxation film 3105 is preferably formed of a silicon oxide film or a silicon oxynitride film by a plasma CVD method to have a thickness of 10 to 5000 nm, preferably 30 to 1000 nm. When a silicon oxynitride film is formed, SiH$_4$ and N$_2$O may be used as a source gas, and a deposition temperature is preferably set 500° C. or lower so that nitrogen is contained at concentration of lower than 20 atom % (preferably, 0.01 to 10 atom %) and hydrogen concentration (and/or OH group) is 1 to 20 atom %.

The bonding layer 3104 is a layer having a planar surface with a hydrophilic property. An insulating layer which is formed by chemical reaction is preferable as a layer capable of forming such a surface. The bonding layer 3104 which has a planar surface with a hydrophilic property is formed to a thickness of 0.2 to 500 nm. With such a thickness, it is possible to smooth surface roughness of a surface of the bonding layer and also to ensure smoothness of the surface of the bonding layer. As the bonding layer 3104, a silicon oxide film is preferably formed. The thickness of the silicon oxide film is from 10 to 200 nm, preferably from 10 to 100 nm, and more preferably from 20 to 50 nm. It is preferable to form a silicon oxide film by a chemical vapor deposition method with use of an organic silane gas.

The support substrate 3101 provided with the barrier film 3106, the relaxation film 3105, and the bonding layer 3104 is brought into close contact with the single crystalline semiconductor substrate 3107 provided with the insulating film 3103 containing halogen so as to be bonded to each other. In this case, the insulating film 3103 containing halogen and the bonding layer 3104 are bonded. The support substrate 3101 and the single crystalline semiconductor substrate 3107 are contacted with each other and pressed, whereby a firm bond can be obtained by hydrogen bond.

Figure 18B:
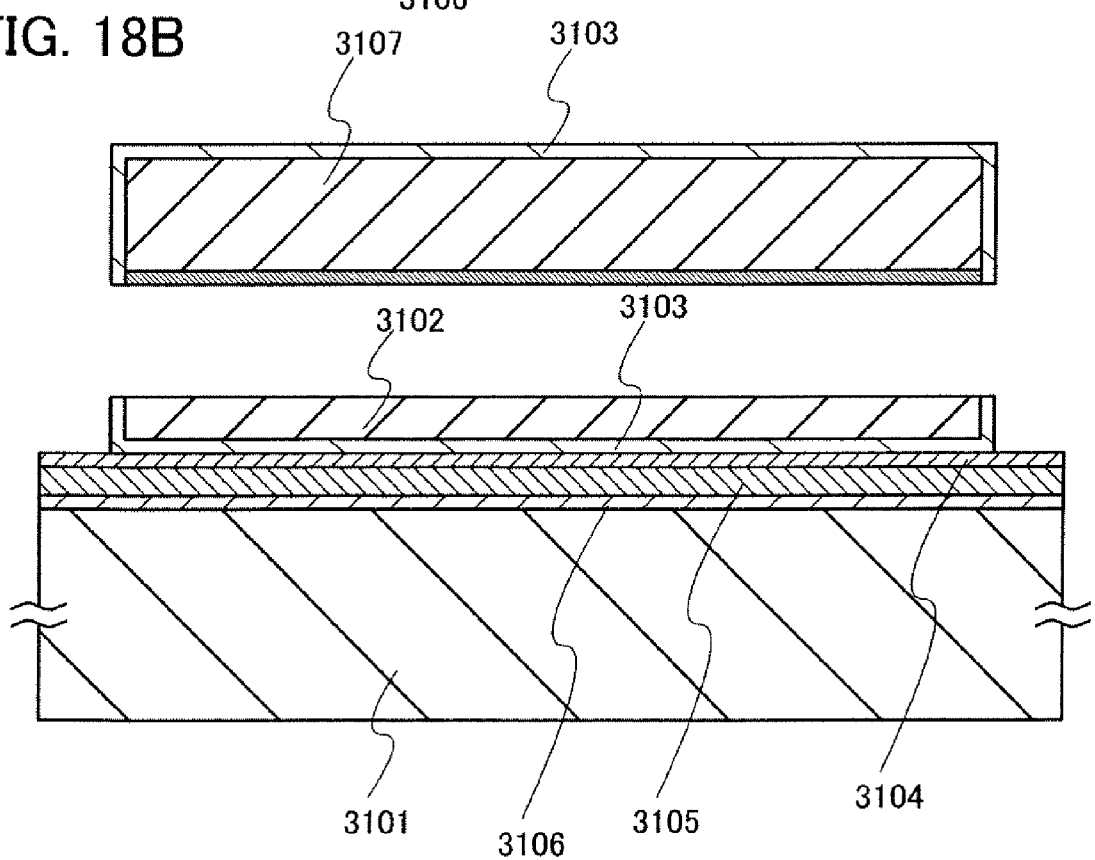

FIG. 18B shows a mode of separating the single crystalline semiconductor layer 3102 from the single crystalline semiconductor substrate 3107. Thermal treatment is performed in a state where the single crystalline semiconductor substrate 3107 and the support substrate 3101 are superposed on each other. Separation of the single crystalline semiconductor substrate 3107 is conducted by thermal treatment so that the single crystalline semiconductor layer 3102 is left on the support substrate 3101. The thermal treatment is preferably conducted at a temperature equal to or higher than a deposition temperature of the bonding layer 3104, which is 400° C. or higher and lower than 600° C. Performing the thermal treatment at a temperature within this range causes volume change in microvoids formed in the separation layer 3108, whereby the semiconductor layer can be cleaved along the separation layer 3108. Since the bonding layer 3104 is bonded to the support substrate 3101, the single crystalline semiconductor layer 3102 having the same crystallinity to the single crystalline semiconductor substrate 3107 is bonded over the support substrate 3101.

Figure 19A:
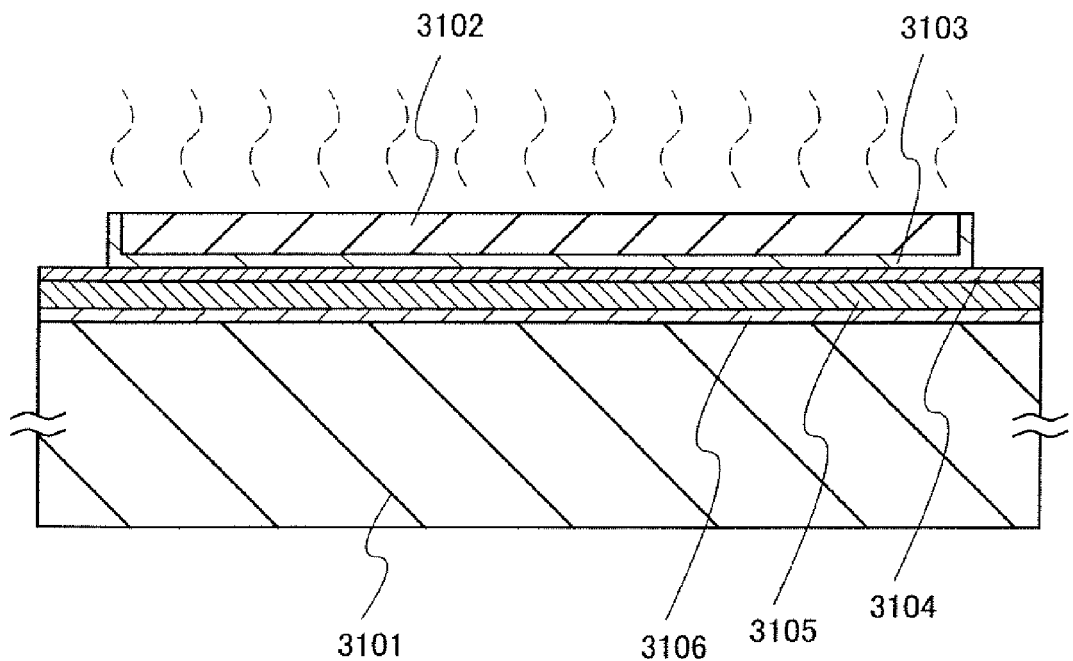
FIGS. 19A and 19B are cross-sectional views describing a method for manufacturing an SOI substrate of the present invention.
Figure 19B:
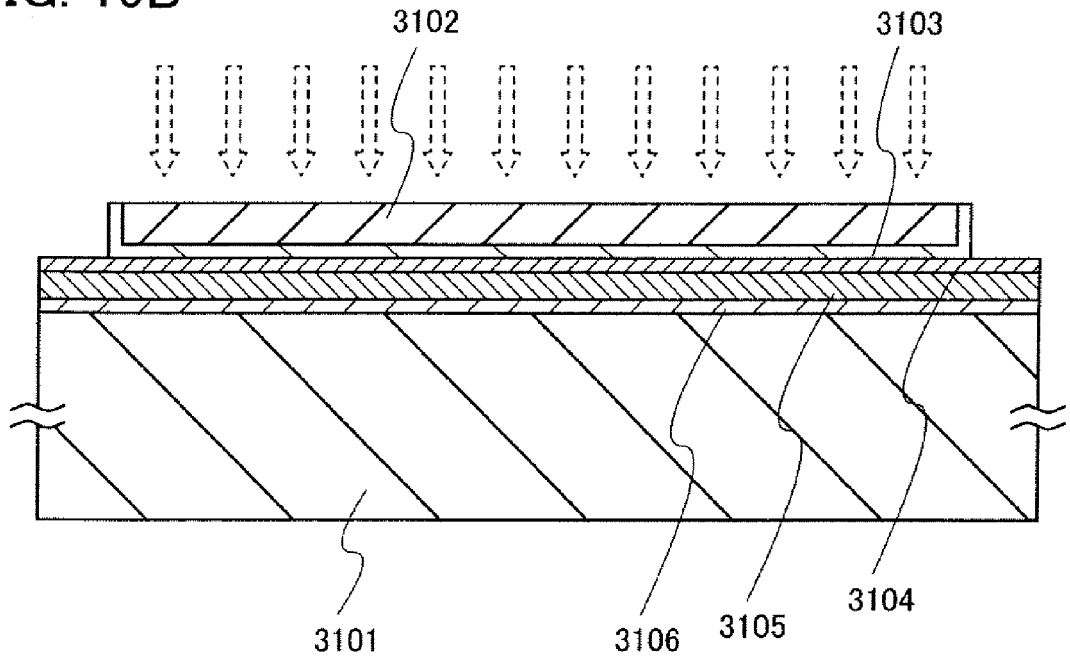

FIG. 19A shows a mode of performing thermal treatment in a state where the single crystalline semiconductor layer 3102 is bonded to the support substrate 3101, which is similar to the case of FIG. 16A. Such thermal treatment can convert the hydrogen bond between the support substrate 3101 and the single crystalline semiconductor layer 3102 into the firmer covalent bond. FIG. 19B shows a mode in which crystal defects are repaired by irradiation of the single crystalline semiconductor layer 3102 with an energy beam, which is similar to the case of FIG. 16B.

According to this embodiment, even if the support substrate 3101 is a glass substrate or the like which has an upper temperature limit of 700° C. or lower, the single crystalline semiconductor layer 3102 can be firmly bonded. As the support substrate 3101, a variety type of glass substrates used in the electronics industry, which employs non-alkali glass, such as aluminosilicate glass substrates, aluminoborosilicate glass substrates, and barium borosilicate glass substrates can be applied. In other words, a single crystalline semiconductor layer can be formed over a substrate of one side which exceeds one meter. With use of such a large-sized substrate, not only a display device such as a liquid crystal display but also a semiconductor device such as a semiconductor integrated circuit can be manufactured. In addition, as to the single crystalline semiconductor substrate, thermal oxidation is performed in an atmosphere containing halogen in the first mode of the manufacturing process, so that a gettering effect can be obtained, which is effective in reutilizing the single crystalline semiconductor substrate.

This application is based on Japanese Patent Application serial no. 2007-149790 filed in Japan Patent Office on Jun. 5, 2007 and Japanese Patent Application serial no. 2007-196781 filed in Japan Patent Office on Jul. 27, 2007 the entire contents of which are hereby incorporated by reference.

What is claimed is:

1. A method for manufacturing a semiconductor device comprising the steps of:
    forming a silicon oxynitride film on an inner wall of a reaction chamber of a plasma CVD apparatus; and
    introducing a substrate having an insulating surface in the reaction chamber after forming the silicon oxynitride film, and successively forming a silicon nitride oxide film over the substrate in the chamber.

2. The method for manufacturing the semiconductor device according to claim 1, wherein the silicon oxynitride film contains oxygen of from 55 to 65 atom %, nitrogen of from 1 to 20 atom %, silicon of from 25 to 35 atom %, and hydrogen and/or an OH group of from 0.1 to 10 atom % in concentration ranges.

3. The method for manufacturing the semiconductor device according to claim 1, wherein the silicon nitride oxide film contains oxygen of from 15 to 30 atom %, nitrogen of from 20 to 35 atom %, silicon of from 25 to 35 atom %, and hydrogen of 15 to 25 atom % in concentration ranges.

4. The method for manufacturing the semiconductor device according to claim 1, further comprising the steps of:
    forming a gate electrode over the substrate;
    forming a semiconductor layer over the substrate,
    wherein the gate electrode and the semiconductor layer are overlapped with each other with the silicon nitride oxide film interposed therebetween.

5. The method for manufacturing the semiconductor device according to claim 4, wherein the semiconductor layer is an amorphous semiconductor film or a microcrystalline semiconductor film.

6. The method for manufacturing the semiconductor device according to claim 4, wherein each concentration of oxygen, nitrogen, and carbon in the semiconductor layer is $1 \times 10^{19}$ cm$^{-3}$ or lower.

7. The method for manufacturing the semiconductor device according to claim 1, the plasma CVD apparatus is a microwave plasma CVD apparatus.

8. The method for manufacturing the semiconductor device according to claim 1, wherein the silicon oxynitride film is formed under conditions that silane is diluted with dinitrogen monoxide by 5 to 50 times of a flow rate, and the substrate temperature is from 250 to 400° C.

9. The method for manufacturing the semiconductor device according to claim 1, wherein the silicon nitride oxide film is formed by using a source gas comprising silane and dinitrogen monoxide.

10. A method for manufacturing a semiconductor device comprising the steps of:
    forming a silicon oxynitride film on an inner wall of a reaction chamber of a plasma CVD apparatus; and introducing a substrate having an insulating surface in the reaction chamber after forming the silicon oxynitride film, and successively forming a stacked layer of a silicon oxynitride film and a silicon nitride oxide film, over the substrate in the chamber.

11. The method for manufacturing the semiconductor device according to claim 10, wherein the silicon oxynitride film contains oxygen of from 55 to 65 atom %, nitrogen of from 1 to 20 atom %, silicon of from 25 to 35 atom %, and hydrogen and/or an OH group of from 0.1 to 10 atom % in concentration ranges.

12. The method for manufacturing the semiconductor device according to claim 10, wherein the silicon nitride oxide film contains oxygen of from 15 to 30 atom %, nitrogen of from 20 to 35 atom %, silicon of from 25 to 35 atom %, and hydrogen of 15 to 25 atom % in concentration ranges.

13. The method for manufacturing the semiconductor device according to claim 10, further comprising the steps of:
forming a gate electrode over the substrate;
forming a semiconductor layer over the substrate,
wherein the gate electrode and the semiconductor layer are overlapped with each other with the silicon nitride oxide film interposed therebetween.

14. The method for manufacturing the semiconductor device according to claim 13, wherein the semiconductor layer is an amorphous semiconductor film or a microcrystalline semiconductor film.

15. The method for manufacturing the semiconductor device according to claim 13, wherein each concentration of oxygen, nitrogen, and carbon in the semiconductor layer is $1 \times 10^{19}$ cm$^{-3}$ or lower.

16. The method for manufacturing the semiconductor device according to claim 10, the plasma CVD apparatus is a microwave plasma CVD apparatus.

17. The method for manufacturing the semiconductor device according to claim 10, wherein the silicon oxynitride film is formed under conditions that silane is diluted with dinitrogen monoxide by 5 to 50 times of a flow rate, and the substrate temperature is from 250 to 400° C.

18. The method for manufacturing the semiconductor device according to claim 10, wherein the silicon nitride oxide film is formed by using a source gas comprising silane and dinitrogen monoxide.

19. A method for manufacturing a semiconductor device, comprising the steps of:
forming a silicon oxynitride film an inner wall of a reaction chamber of a plasma CVD apparatus by using a source gas comprising silane and dinitrogen monoxide; and
introducing a substrate having an insulating surface in the reaction chamber after forming the silicon oxynitride film, and successively forming a silicon nitride oxide film over the substrate in the chamber.

20. The method for manufacturing the semiconductor device according to claim 19, wherein the silicon oxynitride film contains oxygen of from 55 to 65 atom %, nitrogen of from 1 to 20 atom %, silicon of from 25 to 35 atom %, and hydrogen and/or an OH group of from 0.1 to 10 atom % in concentration ranges.

21. The method for manufacturing the semiconductor device according to claim 19, wherein the silicon nitride oxide film contains oxygen of from 15 to 30 atom %, nitrogen of from 20 to 35 atom %, silicon of from 25 to 35 atom %, and hydrogen of 15 to 25 atom % in concentration ranges.

22. The method for manufacturing the semiconductor device according to claim 19, further comprising the steps of:
forming a gate electrode over the substrate;
forming a semiconductor layer over the substrate,
wherein the gate electrode and the semiconductor layer are overlapped with each other with the silicon nitride oxide film interposed therebetween.

23. The method for manufacturing the semiconductor device according to claim 22, wherein the semiconductor layer is an amorphous semiconductor film or a microcrystalline semiconductor film.

24. The method for manufacturing the semiconductor device according to claim 22, wherein each concentration of oxygen, nitrogen, and carbon in the semiconductor layer is $1 \times 10^{19}$ cm$^{-3}$ or lower.

25. The method for manufacturing the semiconductor device according to claim 19, the plasma CVD apparatus is a microwave plasma CVD apparatus.

26. The method for manufacturing the semiconductor device according to claim 19, wherein the silicon oxynitride film is formed under conditions that silane is diluted with dinitrogen monoxide by 5 to 50 times of a flow rate, and the substrate temperature is from 250 to 400° C.

27. The method for manufacturing the semiconductor device according to claim 19, wherein the silicon nitride oxide film is formed by using a source gas comprising silane and dinitrogen monoxide.

* * * * *